US010561040B1

(12) United States Patent
Lunsman et al.

(10) Patent No.: US 10,561,040 B1
(45) Date of Patent: Feb. 11, 2020

(54) FLEXIBLE GASKET SEAL FOR DIRECT LIQUID COOLING OF ELECTRONIC DEVICES

(71) Applicant: Hewlett Packard Enterprise Development LP, Houston, TX (US)

(72) Inventors: Harvey Lunsman, Chippewa Falls, WI (US); Tahir Cader, Liberty Lake, WA (US); Michael Scott, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/154,710

(22) Filed: Oct. 8, 2018

(51) Int. Cl.
*H05K 7/20* (2006.01)
*G06F 1/20* (2006.01)

(52) U.S. Cl.
CPC ..... *H05K 7/20272* (2013.01); *H05K 7/20254* (2013.01); *G06F 1/20* (2013.01); *G06F 2200/201* (2013.01); *H05K 7/20245* (2013.01); *H05K 7/20772* (2013.01)

(58) Field of Classification Search
USPC ........................................................ 361/699
See application file for complete search history.

(56) References Cited

U.S. PATENT DOCUMENTS

| | | | |
|---|---|---|---|
| 4,245,273 A * | 1/1981 | Feinberg | H01L 23/4338 257/714 |
| 4,603,345 A * | 7/1986 | Lee | H01L 23/473 257/691 |
| 5,245,508 A | 9/1993 | Mizzi | |
| 5,259,781 A * | 11/1993 | Baumberger | H01R 13/2435 439/331 |
| 5,282,111 A * | 1/1994 | Hopfer | G01R 1/0408 165/185 |
| 5,305,184 A * | 4/1994 | Andresen | H01L 23/44 165/104.33 |
| 6,111,749 A | 8/2000 | Lamb | |

(Continued)

OTHER PUBLICATIONS

Olesen, K. et al, ShowerPower® Turbulator keeps IGBTs Cool, https://www.mentor.com/products/mechanical/engineering-edge/volume4/issue1/, ShowerPower Turbulator keeps IGBTs Cool; Danfoss Drives, Germany; Kleus Gleson; Engineering Edge, Feb. 2, 2018.

*Primary Examiner* — William H. Mayo, III
*Assistant Examiner* — Krystal Robinson
(74) *Attorney, Agent, or Firm* — Sheppard Mullin Richter & Hampton LLP

(57) ABSTRACT

Systems and methods are provided for a gasket that allows for a single cooling cold plate to touch one or more devices. These devices may have precise but varying thermal interfaces and mounting pressure requirements; and height and co-planarity tolerances that need to be accommodated. The gasket may be sandwiched in between a top stiffener plate and a floating cold plate along an outer perimeter of the gasket; and a rigid, cold plate base and a bottom stiffener plate along an inner perimeter of the gasket. The resulting seal allows coolant to flow between the rigid and floating cold plates as these plates move (i.e., float) with respect to one another. Thus, the gasket aids in a cooling apparatus achieve an optimum thermal interface with each of the one or more devices simultaneously, while accounting for the individual tolerance variations across each device.

20 Claims, 18 Drawing Sheets

(56) References Cited

U.S. PATENT DOCUMENTS

| | | | | |
|---|---|---|---|---|
| 6,212,074 B1* | 4/2001 | Gonsalves | ......... | H01L 23/4006 |
| | | | | 165/185 |
| 6,233,959 B1* | 5/2001 | Kang | .................. | F25D 19/00 |
| | | | | 257/E23.096 |
| 7,254,027 B2* | 8/2007 | Belady | .................. | G06F 1/20 |
| | | | | 361/690 |
| 7,285,851 B1 | 10/2007 | Cepeda-Rizo | | |
| 7,515,418 B2 | 4/2009 | Straznicky | | |
| 7,751,918 B2* | 7/2010 | Campbell | ......... | H05K 7/20809 |
| | | | | 361/274.2 |
| 7,830,664 B2* | 11/2010 | Campbell | ................ | G06F 1/20 |
| | | | | 165/80.4 |
| 8,934,250 B2 | 1/2015 | Campbell | | |
| 9,564,385 B2* | 2/2017 | Schmit | ................ | H01L 23/473 |
| 2007/0091570 A1* | 4/2007 | Campbell | ................ | G06F 1/20 |
| | | | | 361/699 |
| 2007/0163749 A1* | 7/2007 | Miyahara | ............ | H01L 23/473 |
| | | | | 165/80.3 |
| 2008/0084664 A1* | 4/2008 | Campbell | ................ | G06F 1/20 |
| | | | | 361/699 |
| 2009/0213541 A1* | 8/2009 | Butterbaugh | ........ | H01L 23/473 |
| | | | | 361/689 |
| 2019/0168223 A1* | 6/2019 | Soto-Moreno | ........... | B81B 1/00 |

* cited by examiner

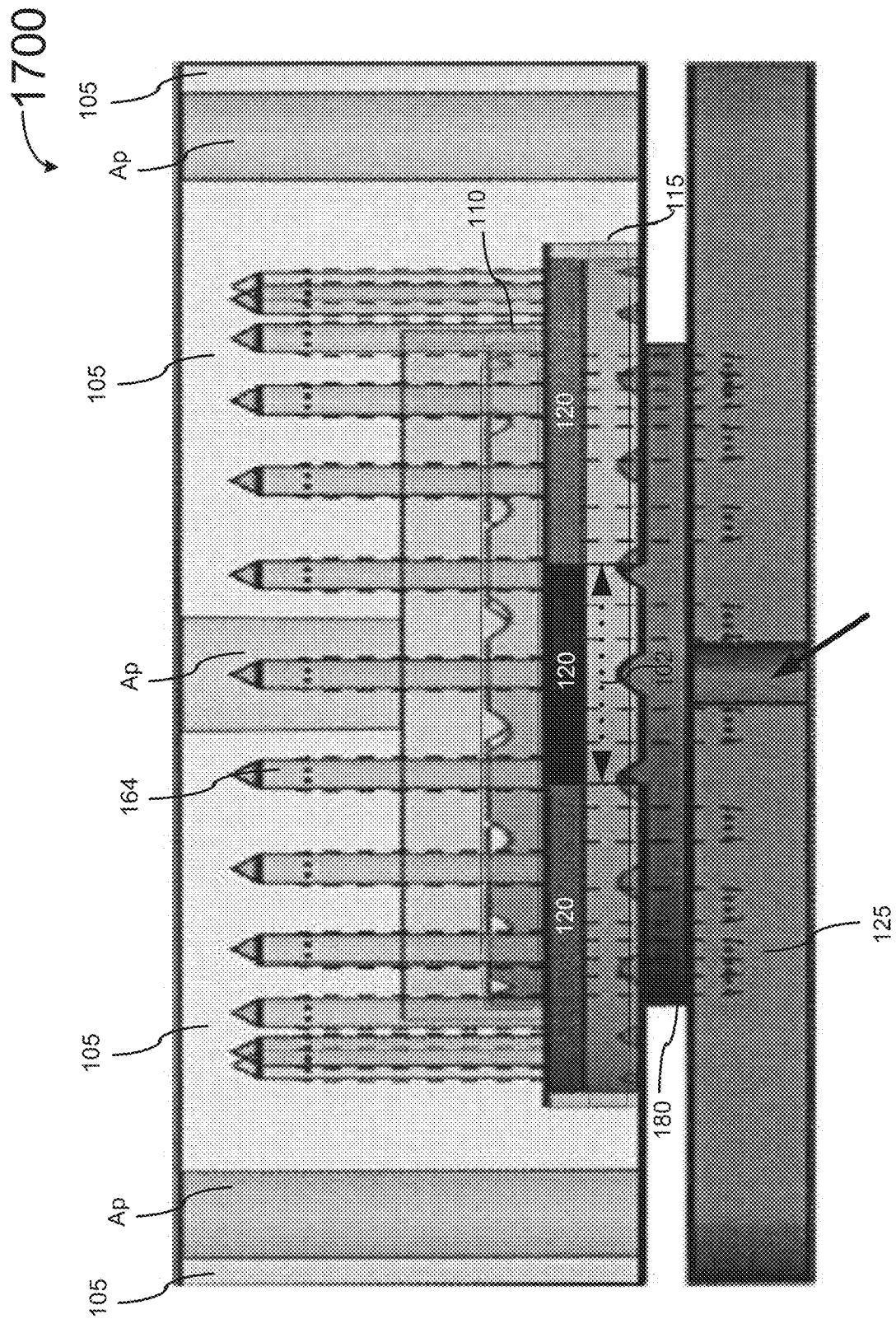

FLEXIBLE GASKET SEAL FOR DIRECT LIQUID COOLING OF ELECTRONIC DEVICES

BACKGROUND

New generations of semiconductor and other electronic components are continuously decreasing in size to meet the technical requirements of the electronics industry. These smaller components are often incorporated into devices, such as mobile phones and computers. However, these smaller components, and in turn devices, are still prone to failure mechanisms imposed by high absolute temperatures and temperature changes during cycling. The high absolute temperatures and the temperature changes produce thermally and mechanically induced stresses and strains in the material interfaces of these smaller components. In turn, the induced stresses and strains lead to fatigue failures. Discrete liquid-cooled or motherboard cold plates are used as cooling assemblies within high-power electronic devices that continuously demand increasing power densities. The heat transfer coefficients in liquid-cooled devices are often several orders of magnitude higher than the heat transfer coefficients in air-cooled devices. Thus, liquid cooling is more effective than air cooling at mitigating undesired heat generation due to conductive and switching losses in high-power electronic devices.

Liquid-cooling solutions may either indirectly or directly cool a component. Direct liquid cooling occurs when there is a direct conduction path between a power module and coolant fluid. Indirect liquid cooling is when the component to be cooled is initially exposed to air and the air is then exposed to coolant fluid. In turn, the coolant fluid removes heat from the air that initially cooled the component.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 17 is a side view of an assembled cooling apparatus containing a rounded shaped sealing gasket.

The figures are not exhaustive and do not limit the present disclosure to the precise form disclosed.

DETAILED DESCRIPTION

A single liquid-cooling cold plate touching multiple devices (and/or components within these devices) may be used to cool these devices simultaneously. Some examples of the heat generating devices include these components: a central processing unit, a graphics processing unit, a dual in-line memory module (DIMM), a single in-line memory module (SIMM), and power conversion hardware (such as voltage regulator module components), etc. Moreover, the heat generating devices are cooled by the liquid-cooling cold plate, wherein the heat generating devices and liquid-cooling cold plate reside within a computing or electronics system.

Each of these devices may have different height and co-planarity tolerances leading to differences in height from one device to the next. Various embodiments are directed to cooling apparatuses containing rigid cold plates. In other embodiments, the cooling apparatus contains flexible cold plates attached by a seal at point which is rigid to ensure a secure seal. More specifically, in various embodiments, a flexible gasket seal is placed between rigid cold plates in a cooling apparatus, such that a single rigid cold plate is maintained in touching relation to the multiple devices. The multiple devices, each of which have precise thermal interface and mounting pressure requirements, are cooled by the single rigid cold plate of the cooling apparatus. Simultaneously, the flexible gasket seal, which is placed between the rigid cold plates, allows the cooling apparatus to accommodate/account for height and co-planarity tolerances between devices among the multiple devices within the computing or electronic systems.

Without the flexible gasket seal, the height differences of each of device among a plurality of devices touching the single rigid cold plate cannot be accommodated, while also maintaining sufficient thermal interfaces needed to cool each device. Thus, the rigid cold plate would have difficulty maintaining physical contact with multiple devices having height and co-planarity tolerances, thereby impacting the effectiveness of cooling the multiple device and their components.

Figure 2:
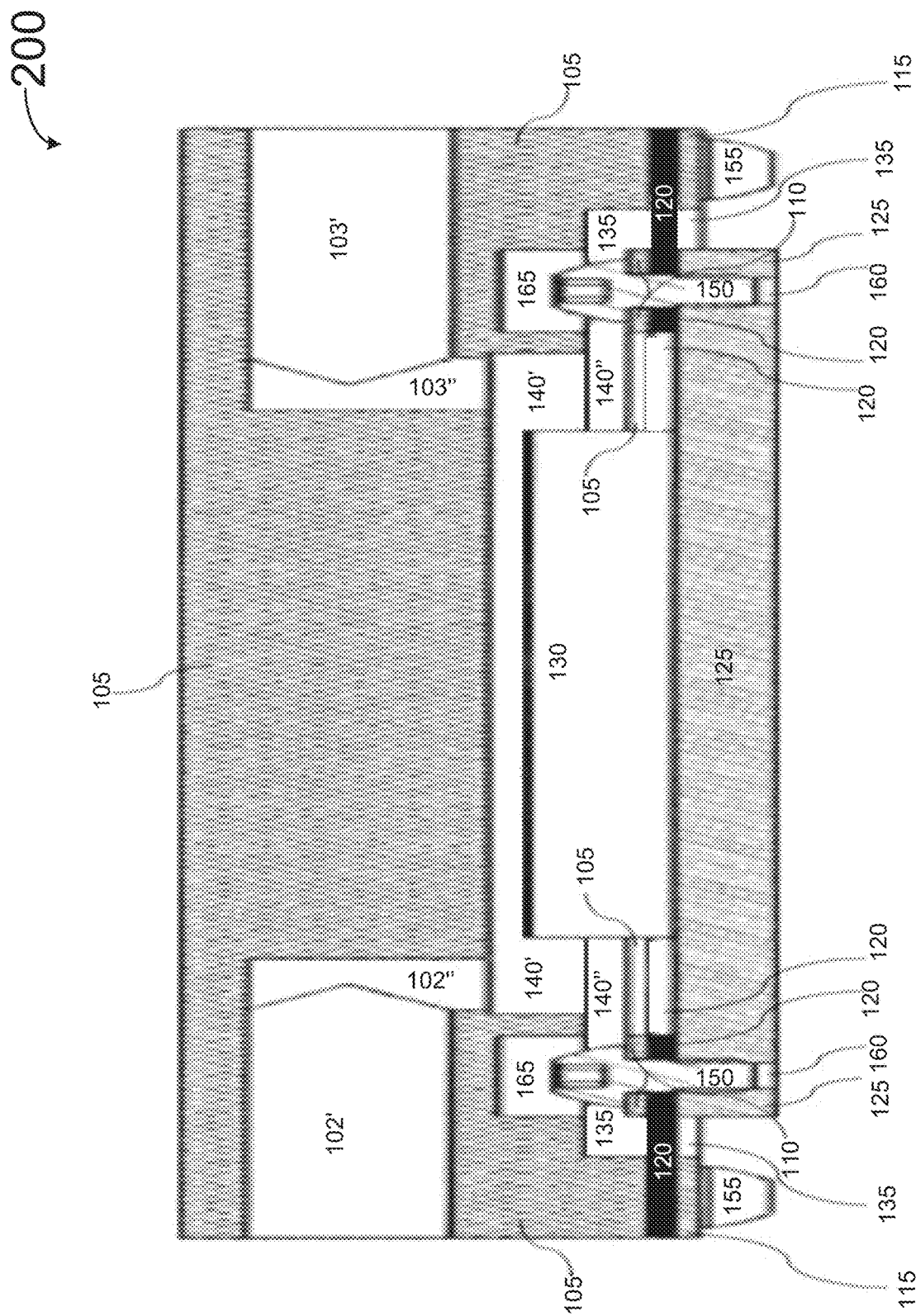
FIG. 2 is a cross sectional view of an assembled cooling apparatus containing a sealing gasket that is held together by fasteners.

Reference is made to the accompanying figures to depict specific examples in which the present disclosure may be practiced. When describing the figures, some part numbers may be denoted with one or more apostrophes ('). The apostrophes are invoked to differentiate regions or zones of a same structural element of a cooling apparatus. For example, regions of inlet 102 and outlet 103 in FIG. 2 are distinguished with apostrophes. Inlet 102' and inlet 102" are two different regions of inlet 102, whereas outlet 103' and outlet 103" are two different regions of outlet 103. While terms such as top, bottom, left, right, above, below, etc. may be used to describe various features of the disclosed embodiments with reference to the drawings, these terms are not intended to imply any particular spatial orientation of the assemblies depicted herein. These terms are merely provided for clarity of description.

Figure 1:
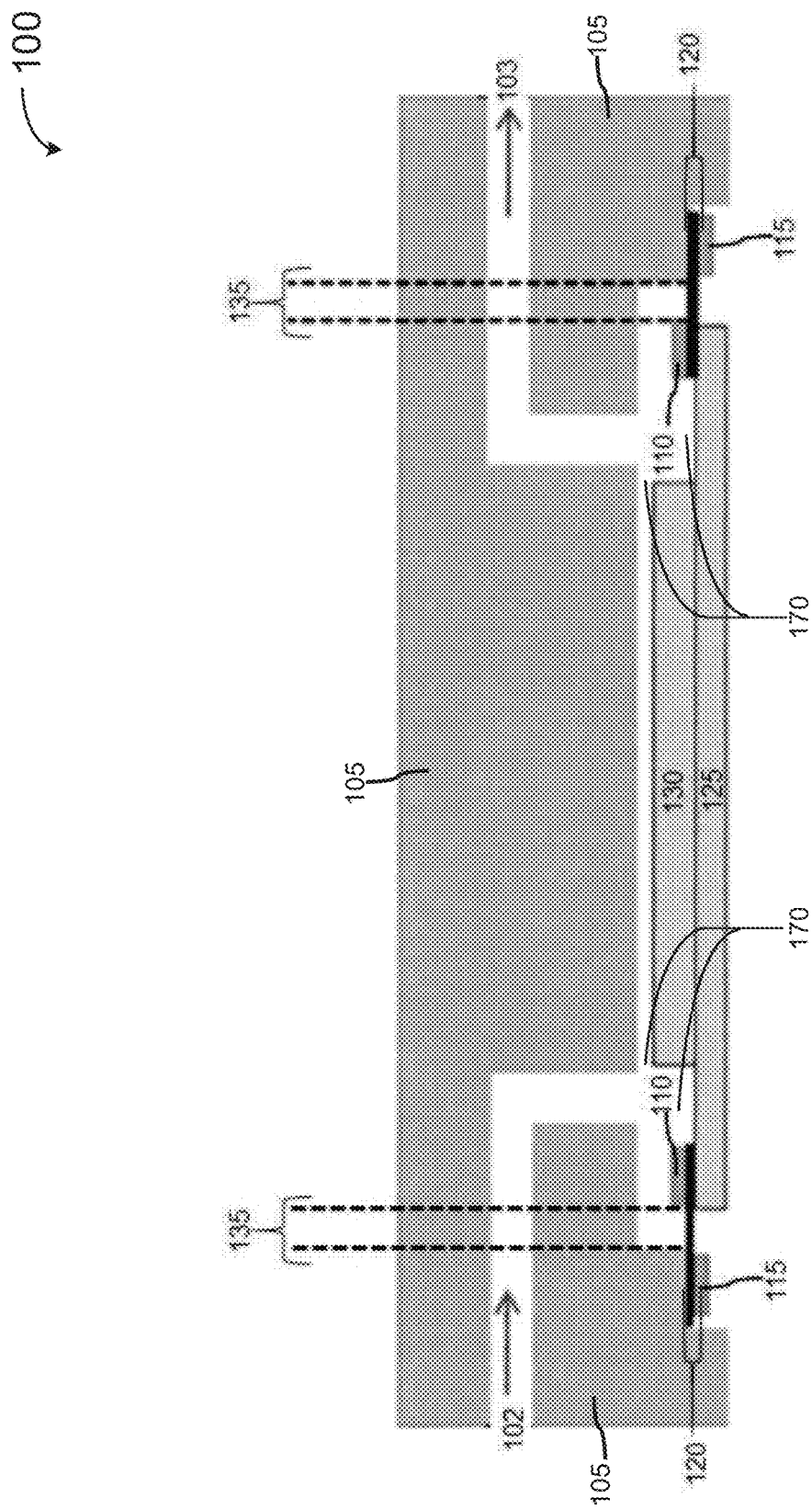
FIG. 1 is a cross sectional view of an assembled cooling apparatus containing a sealing gasket.

FIG. 1 is a cross sectional view of an assembled cooling apparatus containing a sealing gasket in accordance with one embodiment. More specifically, cooling apparatus 100 contains a cold plate affixed to the components for efficient cooling of the components. Inlet 102 may receive coolant in liquid or fluid form, such as water or gas. The coolant may be transported from inlet 102 to outlet 103 in the cooling apparatus through a resulting cavity (or channel) 170, formed in part by gasket 120 situated between cold plate 105 and cold plate 125. Additional components, such as fins 130 (as described in more detail below), may also reside in this resulting cavity.

Cold plate 105 and cold plate 125 may be constructed of rigid, thermally conductive materials. In this example, thermally conductive materials are used in heat sink applications to transfer heat generated from an electronic device to liquid coolants in channel 170. Thermal conductivity is the quantity of heat in that passes in unit time through a plate of particular area and thickness when its opposite faces differ in temperature by one kelvin. The higher the thermal conductivity (Watts/(meter·Kelvin)), the more effective the material is at transferring heat to a liquid coolant. Cold plate 105 and cold plate 125 are constructed of thermally conductive materials that have thermal conductivity values of at least 200 Watts/(meter·Kelvin). In some embodiments, cold plate 105 is a rigid base agnostic to the conductive materials incorporated into the cooling apparatus; and cold plate 125 is a floating rigid plate for cooling a high-power device. Cold plate 105 may be constructed of thermally conductive materials, such as aluminum, copper, stainless steel, and thermally conducting plastics. The thermal conductivity of thermally conductive plastics is 5 to 100 times the value of plastics considered thermal insulators. Some of the polymer bases of the thermally conductive plastics include polypropylene, polyphenylene sulfide, polycyclohexylene-dimethyl terephthalate, polyacrylates, polyesters, and acetal copolymers. There is a class of thermally conducting plastics that combine thermal conductivity with electrical isolation, where the thermal conductivity ranges from 1-10 Watts/meter·Kelvin. There is another class of thermally conducting plastics that combine thermal conductivity with electrical conductivity, where the thermal conductivity ranges from 2-40 Watts/meter·Kelvin. In one example application, cold plate 105 is composed of rigid, thermally conductive plastics; and cold plate 125 is composed of copper. In another example application, cold plate 105 is composed of aluminum; and cold plate 125 is composed of copper.

Stiffener plate 110 and stiffener plate 115 are fastening materials used to secure a gasket seal, such as gasket 120, in a desired position. For example, stiffener plate 110 and stiffener plate 115 are metal plates physically connected at positions directly above and directly below gasket 120, respectively. In the illustrated example, stiffener plate 110 physically connects at positions directly below rigid cold plate 105; and stiffener plate 115 physically connects at positions directly above rigid cold plate 125.

Gasket 120 is positioned between cold plate 125 and cold plate 105 and held in place by stiffener plates 110, 115. Gasket 120 may be implemented as a pliable, compliant, or otherwise malleable material that is also a pressure-rated seal to provide an adequate sealant to prevent coolant leakage from the cavity between inlet 102 and outlet 103. In various embodiments, gasket 120 includes a rubberized exterior (e.g., reinforced neoprene or silicone rubber) and a plastic interior. The rubberized and plastic compositions in gasket 120 may be thermally stable, pliable, and more flexible than the cold plates. When positioned in place between the two rigid cold plates 105, 125, gasket 120 imparts fluid-sealant properties to the cooling apparatus.

Additionally, the pliability of gasket 120 permits cold plate 125 to move relative to cold plate 105. More specifically, the flexible fluid seal provided by gasket 120 allows a rigid cold plate, such as cold plate 125, to deflect relative to cooling apparatus 100 to accommodate height and co-planarity differences among devices being cooled. In some embodiments, a height tolerance difference of at least ±1 mm between the devices directly cooled by a single rigid cold plate is observed. This height tolerance difference of at least ±1 mm may be implemented with ubiquitous devices, such as a central processing unit (CPU). For example, an Intel® Sky Lake CPU, which may be incorporated into high performance computing (HPC) or other computing products (e.g., HPE Apollo 6500 Gen10), has a height tolerance difference of ±0.36 millimeters (mm). Thus, there may be a height difference of up to 0.72 mm from one CPU to an adjacent CPU. The float provided by gasket 120 positioned between the two rigid cold plates 105, 125 allows cold plate 125 to deflect sufficiently to maintain physical contact with each Intel Sky Lake CPU thermal interface. In this example, cold plate 125 is affixed to the CPU where other rigid portions of cooling apparatus 100 may deflect relative to cold plate 125. Accordingly, height and co-planarity tolerances between the two CPUs are accommodated by positioning gasket 120 between cold plate 105 and 125.

The pliability of gasket 120 may be increased or decreased by modulating the composition and thickness of gasket 120. Adjusting these parameters may allow for more precise control of mounting pressures and thermal interface bond lines between devices cooled by a single rigid cold plate. This is in contrast to discrete units of liquid-cooled cold plates and full motherboard cold plates.

When using discrete units of liquid-cooled cold plates, a large amount of tubing is needed on the motherboard for directing the coolant. More specifically, while the tubing may allow coolant to be directed between devices while accounting for height and co-planarity tolerance differences, the tubing also increases the potential for coolant leakage and cold plate complexity. Additionally, the tubing competes for space with electrical cabling, and can obstruct the air flow path. In contrast, gasket-induced seal gasket 120 provides a seal that guards against coolant leakage yet may be implemented without the need for complex flexible tube routing, such as the large amount of tubing required for liquid-cooled cold plates.

When using full motherboard cold plates, the cold plates are typically machined out of aluminum. The aluminum used in motherboard cold plates is bulky, heavy, inflexible, and expensive. The inflexibility introduces tolerance issues when cooling devices at different heights, resulting in decreased thermal performance. Furthermore, if O-ring style seals are used with the motherboard cold plates, there is a potential for coolant leakage. Conventional O-ring style seals typically only account for a height tolerance difference of ~0.5 mm between devices. In contrast, the embodiments disclose a gasket seal that allows for a single rigid cold plate to account for a height tolerance difference of at least 1.0 mm between devices. Gasket 120 is compatible with diverse types of rigid cold plates and may allow the cold plates 105 to be implemented without the bulkiness, weight, inflexibility, and cost associated with the aluminum used in the motherboard cold plates.

Cooling fins 130 may be provided in physical contact with, or directly attached to, cold plate 125. The surfaces of fins 130 may extend from cold plate 125 to increase the rate of heat transfer to coolant in cavity 170. Heat transfer may be enhanced by fins 130 by increasing the temperature gradient between the object and surrounding environment; increasing the convection heat transfer coefficient; and increasing the surface area of the object. There are instances where the increased temperature gradient and convection heat transfer coefficient are not feasible or economical. Thus, fins 130 may be included to increase the surface area for enhanced heat transfer. Fins 130 may be composed of a copper variant identical to the copper variant in cold plate 125. Cold plate 125 and cold plate 105 physically connect directly below and directly above gasket 120, respectively, to form the cavity which is a conduit for the cooling liquid. In another embodiment, fins 130 are skived and thinly sliced heatsinks that transfer heat to the cooling liquid. In various embodiments, fins 130 are not limited to copper or skived variants. In some embodiments, fins 130 may also be an extended surface; extruded aluminum or machined variant; or in a pin, zipper, snapped, bonded, or folded shape.

With continued reference to FIG. 1, the cooling liquid enters through inlet 102 on the left-hand side of cooling apparatus 100; passes through a channel, such as channel 170; and leaves through outlet 103 on the right-hand side of cooling apparatus 100. Fins 130, which are attached to cold plate 125, are located within cavity 170. In this example, fins 130 and cold plate 125 are composed of copper. As depicted in FIG. 1, gasket 120 provides a seal for the cooling liquid within cooling apparatus 100. Additionally, stiffener plates 110 and 115 secure gasket 120 to cold plate 125 and cold plate 105, respectively.

The dimensions of gap 135 may be increased or decreased to achieve more or less compliance, as needed by the devices to be cooled. The thickness and pressure rating of gasket 120 influences a float of the devices to be cooled relative to a rigid cold plate, such as cold plate 125. For example, multiple surfaces of cold plate 125 share cold plate 105 to simultaneously cool multiple devices of different heights due to tolerance variations. A rigid cold plate is able to deflect up or down by a greater amount where the dimensions of gap 135 are wider, as opposed to narrower dimensions of gap 135. A stiffer material in gasket 120 may also have a similar effect to closing the dimensions of gap 135.

FIG. 2 illustrates a cross-sectional view of an assembled cooling apparatus containing a sealing gasket that is held together by fasteners, in accordance with one embodiment. Cooling apparatus 200 in this example includes the base cold plate 105; floating cold plate 125; and a sealing interface region. Sealing interface region may be gasket 120, which is connected to base cold plate 105 and floating cold plate 125 via fasteners 150 and 155.

A cooling liquid initially enters cooling apparatus 200 at inlet 102'. The cooling liquid subsequently passes from inlet 102" to outlet 103" via gap 140'. The cooling liquid finally leaves cooling apparatus 200 at outlet 103'. Cooling fins 130, which are attached to cold plate 125, are located within a cavity, such as channel 170 (which is not labeled in FIG. 2). As depicted in the left-hand side and right-hand sides of cooling apparatus 100, gasket 120 seals the cooling liquid within cooling apparatus 100; and stiffener plates 110 and 115 further secure gasket 120 to cold plate 125 with connector 150 and cold plate 105 with fasteners 155, respectively.

Fasteners 150 and 155 may be screws or any type of hardware that mechanically joins cold plate 105 stiffener plate 110, gasket 120, stiffener plate 115, and cold plate 125 to each other. In the illustrated example, fasteners 155 are screws. The shaded portions of gasket 120 and stiffener plate 110 represent portions of these structural elements that are adjacent to connector hole 160. Zone 165 is a groove used as screw head clearance for fastener 150. Additionally, zone 165, which is adjacent to gap 135, may alleviate pressure build-up in a cooling apparatus upon dimensional expansion of gap 135. Gap 140" is adjacent to gap 140'; fins 130; zone 165; and connector 150. As described above with reference to FIG. 1, the dimensions of gap 135 may be modified in cooling apparatus 200.

Figure 3:
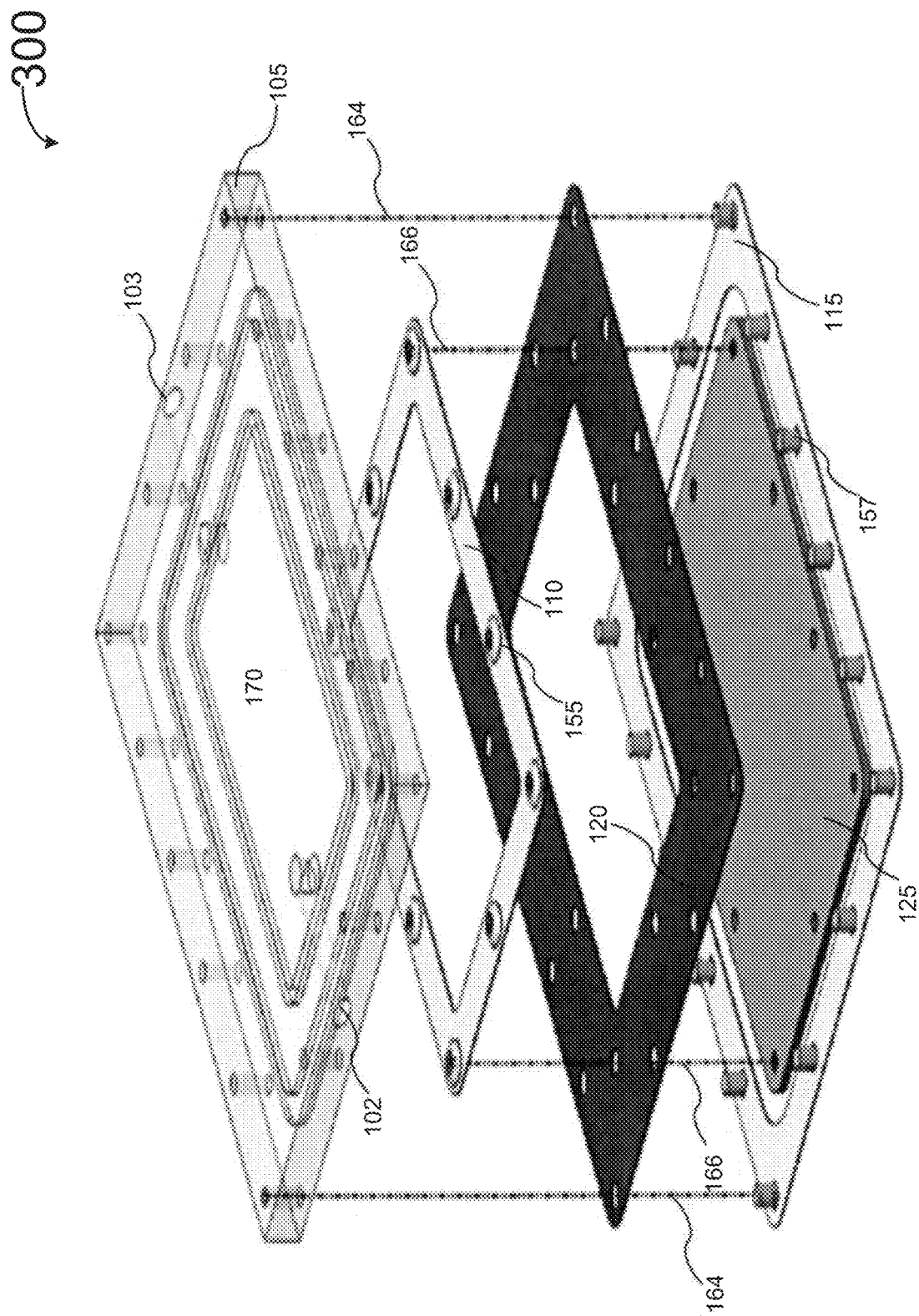
FIG. 3 is an exploded view of the structural elements for assembling cooling apparatus containing a sealing gasket that is held together by fasteners.

FIG. 3 is an exploded view of a cooling apparatus containing a sealing gasket in accordance with one embodiment. Cooling apparatus 300 in this example includes base cold plate 105; floating cold plate 125; stiffener plates 110 and 115; and gasket 120, wherein gasket 120 is attached to base cold plate 105 and floating cold plate 125 via fasteners 155 and 157.

Cold plate 105 contains inlet 102 and outlet 103. In other embodiments, cold plate 105 contains a plurality of units of inlet 102 and outlet 103. Cooling liquid, which is received at inlet 102 and exits at outlet 103, passes through channel 170. In the illustrated example, cold plate 105 is a transparent conducting plastic. Stiffener plate 115 is placed around cold plate 125, wherein cold plate 125 is positioned approximately in the center of stiffener plate 115 and below channel 170. Gasket 120 is positioned on top of cold plate 125 and stiffener plate 115 along connections 166 and 164, respectively. Additionally, gasket 120 is positioned below another stiffener plate, stiffener plate 110 and cold plate 105 along connections 164 and 166, respectively. These physical connections result in the outer peripheries of stiffener plate 110 and cold plate 125 matching up along connections 164 when assembled. Similarly, the outer peripheries of stiffener plate 115 and cold plate 105 match up along connections 166 when assembled. Fasteners 155 (e.g., screws, pins, or other mechanical fasteners) can be located about the periphery of stiffener plate 110 and can be used to attach stiffener plate 110 to cold plate 125 with gasket 120 positioned in between. Similarly, fasteners 157 (e.g., screws, pins, or other mechanical fasteners) can be used to attach cold plate 105 stiffener plate 115 with gasket 120 positioned in between. Although mechanical fasteners are illustrated for fasteners 155 and 157, chemical fasteners, such as adhesives, may alternatively be used. Although the example illustrated in FIG. 3 includes 8 fasteners 155 and 16 fasteners 157, other quantities of fasteners may be used.

Figure 4:
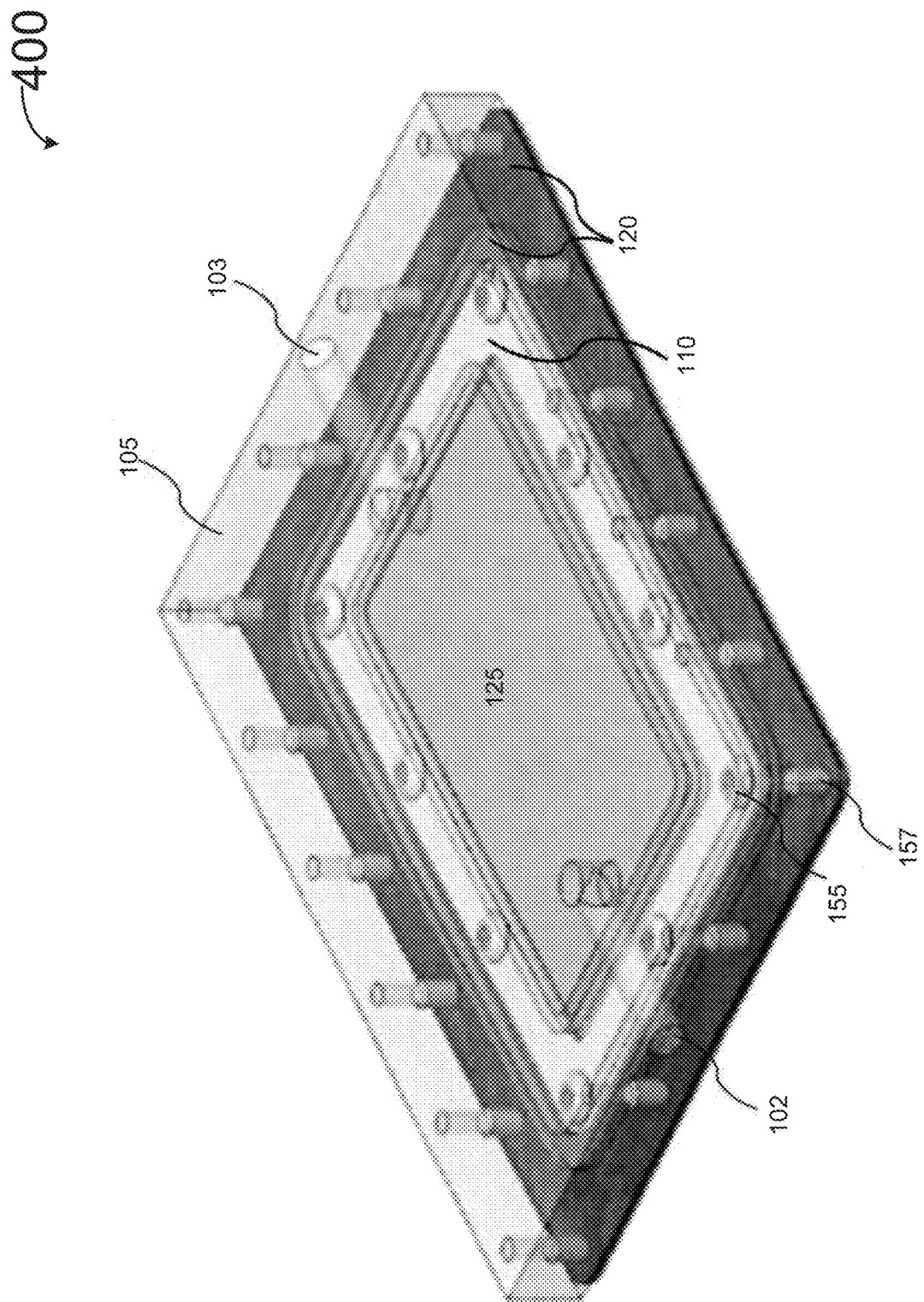
FIG. 4 is a plan view of an example of an assembled cooling apparatus containing a sealing gasket that is held together by fasteners.

FIG. 4 is a plan view of the cooling apparatus of FIG. 3 when assembled. The inner perimeter of gasket 120, which covers the periphery of floating cold plate 125, is held in place by stiffener plate 110.

In another embodiment, gap pads (not depicted in FIG. 4) are located outside the assembled cooling apparatus 400. More specifically, the gap pads may be composed of thermal interface materials (TIMs) or grease TIMs positioned underneath the surface of cold plate 125. In operation, the cooling fluid is directed into inlet 102, flows through the channel 170 above the cooling plate, and exits at outlet 103. Devices that are in operation generated heat, which is transferred to the cooling fluid in the channel (e.g., channel 170) via the gap pads and cold plate 105.

Figure 5:
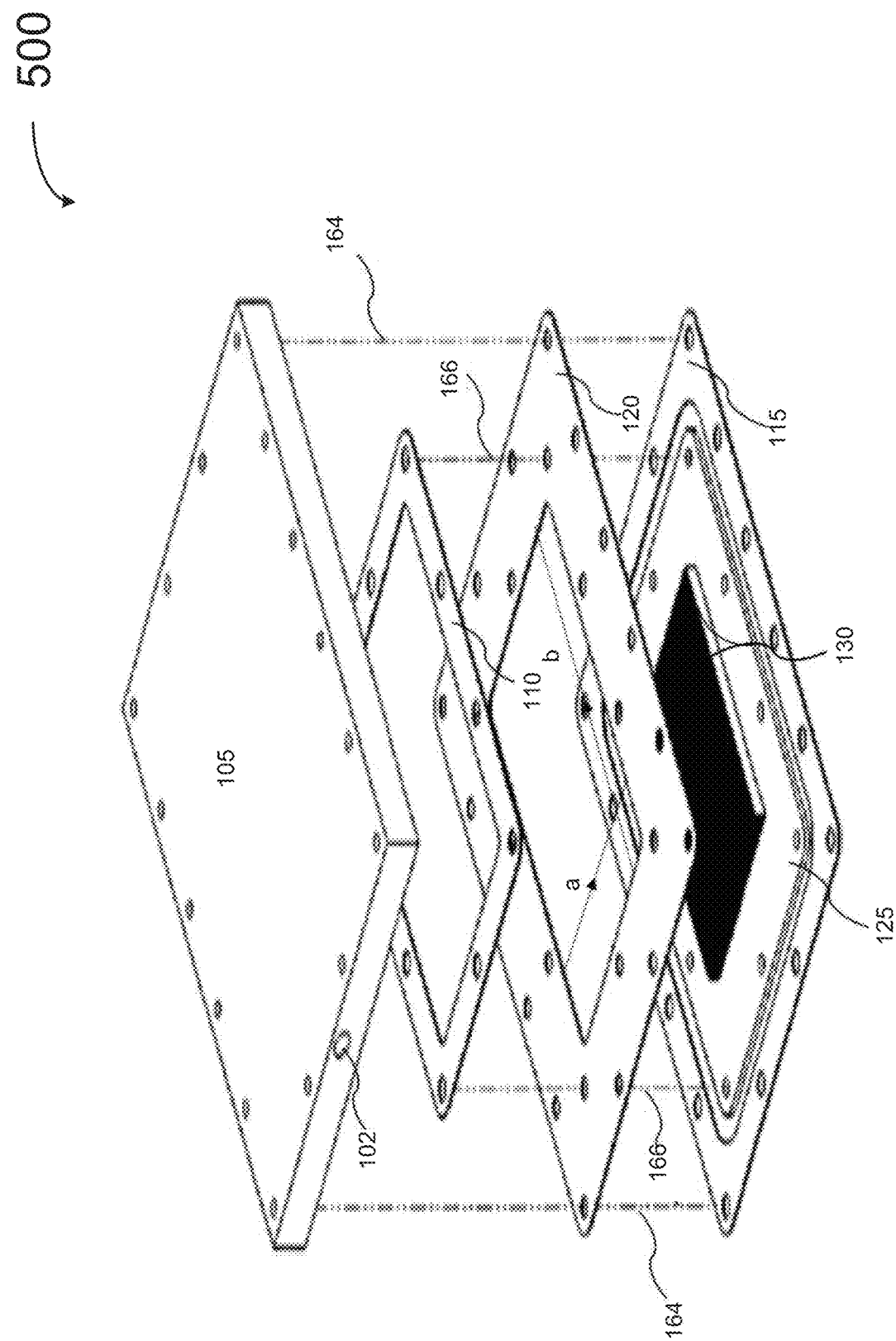
FIG. 5 is an exploded view of the structural elements for assembling a cooling apparatus containing a sealing gasket covered by a cold plate.

FIG. 5 is an exploded view of a cooling apparatus 500, in accordance with another embodiment. In this embodiment, cold plate 105 is a non-transparent, thermally conductive material such as, for example, a copper plate. Cooling apparatus 500 also includes fins 130 that can be used to increase the rate of heat transfer. Fins 130 may be skived fins that are physically connected to cold plate 125. Fins 130 can fit within the interior, open section of gasket 120, as depicted by the area of "a"×"b."

Figure 6:
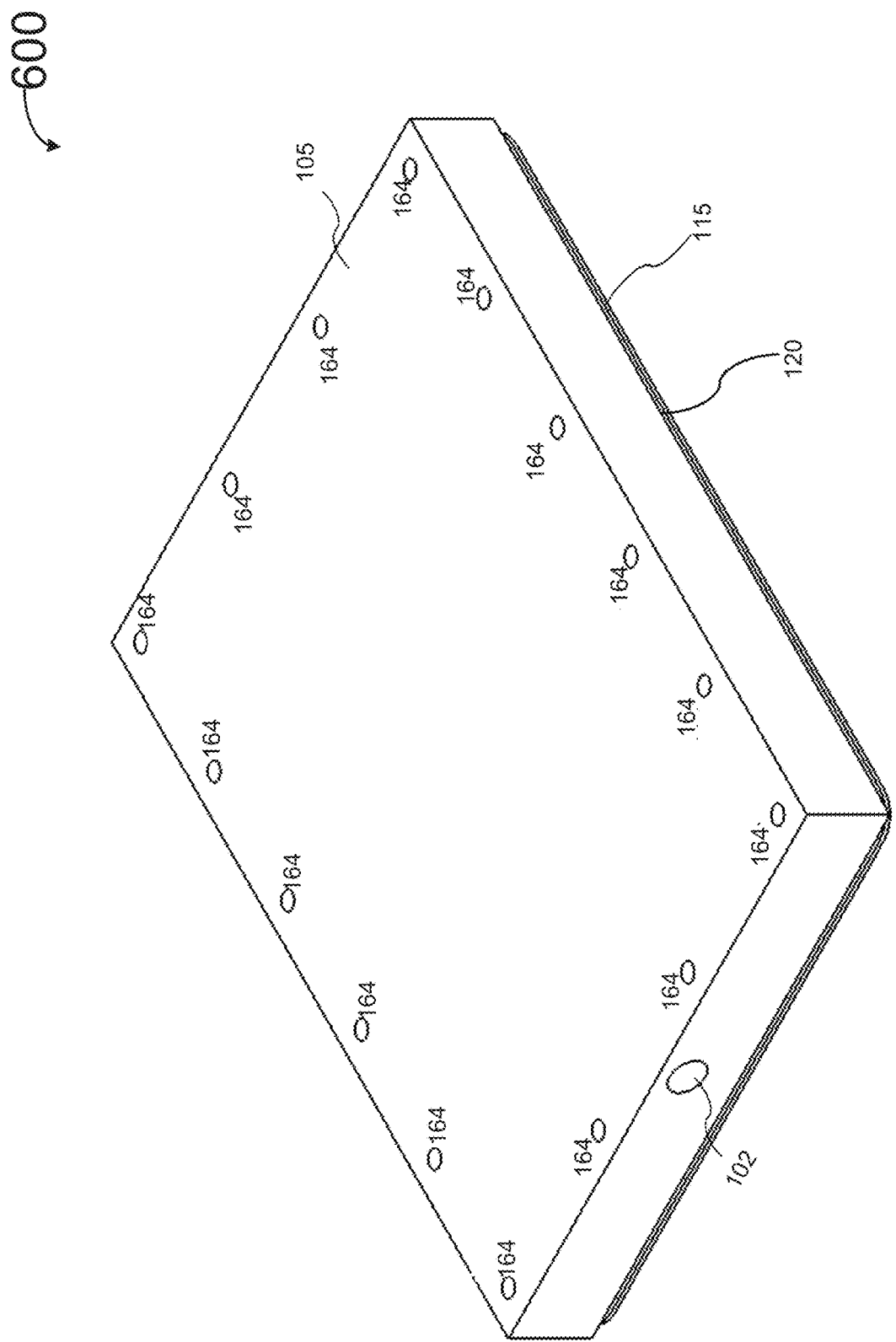
FIG. 6 is a plan view of another assembled cooling apparatus containing a sealing gasket.

FIG. 6 is a plan view of another example of an assembled cooling apparatus. In this illustrated example, cooling apparatus 500 of FIG. 5 is in its assembled configuration. Cooling apparatus 600 is depicted in a top isometric view. The outer perimeter of gasket 120, which is covered by the periphery of cold plate along connections 166, is held in place by stiffener plate 115.

Figure 7:
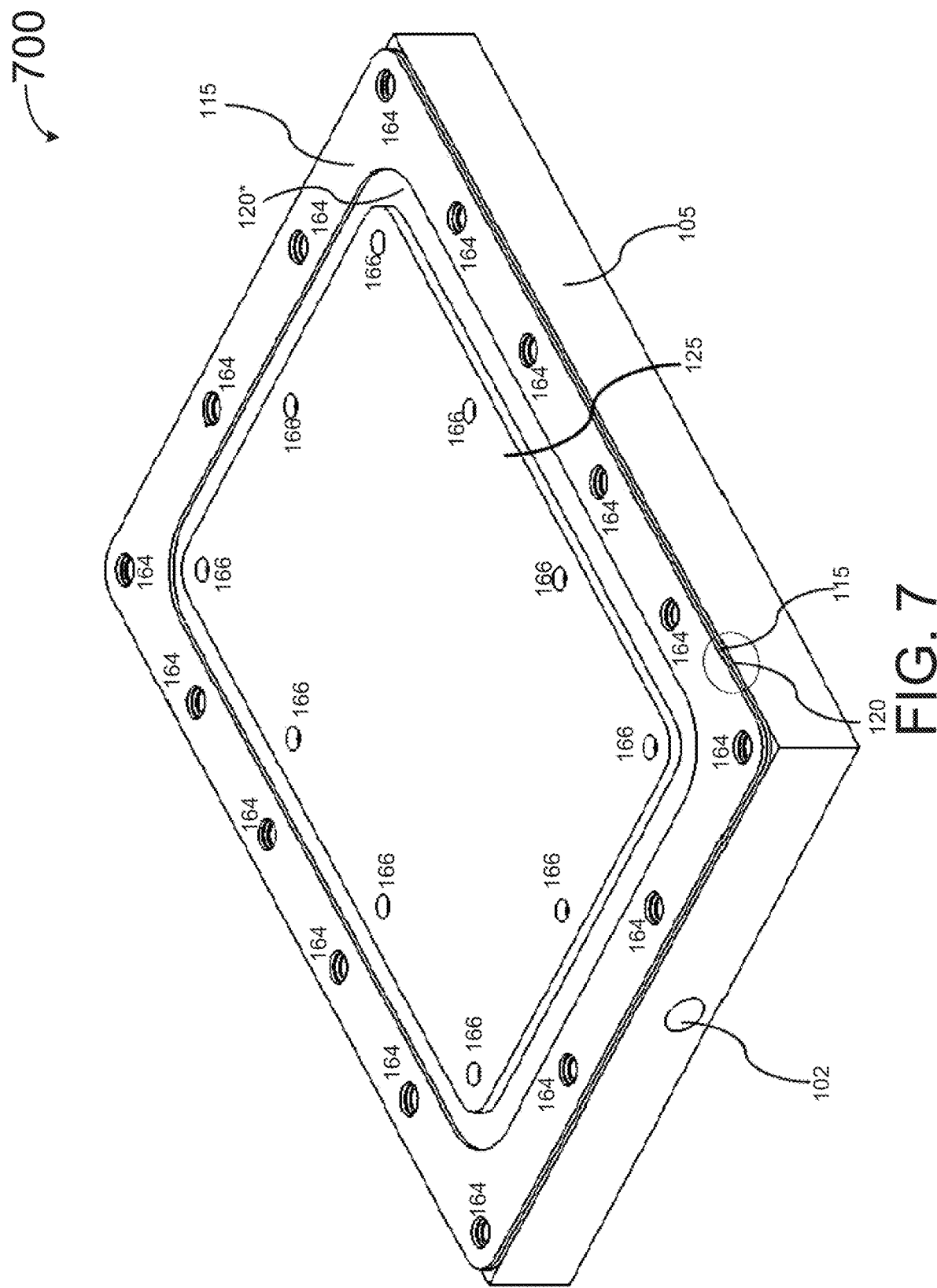
FIG. 7 is a plan view of an assembled cooling apparatus containing a sealing gasket rotated by 180 degrees.

FIG. 7 is another plan view of another example of an assembled cooling apparatus. In this illustrated example, cooling apparatus of FIG. 5 is in its assembled configuration and rotated by 180 degrees. Cooling apparatus 700 is depicted in a bottom isometric view. The outer perimeter of gasket 120 is connected to stiffener plate 115 and cold plate 105 at connections 166 and the inner perimeter of gasket 120 is connected to cold plate 125 at connections 164. From this arrangement of connections, exposed/uncovered regions 120* of gasket 120 result, wherein the exposed/uncovered regions 120* are adjacent to stiffener plate 115 and cold plate 125. Regions 120* allow cold plate 125 to move relative to cold plate 105 and stiffener plate 115 to accommodate height differences and co-planarity tolerances among the devices being cooled. The flexibility of gasket 120 allows the position of cold plate 125 to change relative to stiffener plate 115 and cold plate 105.

Figure 8:
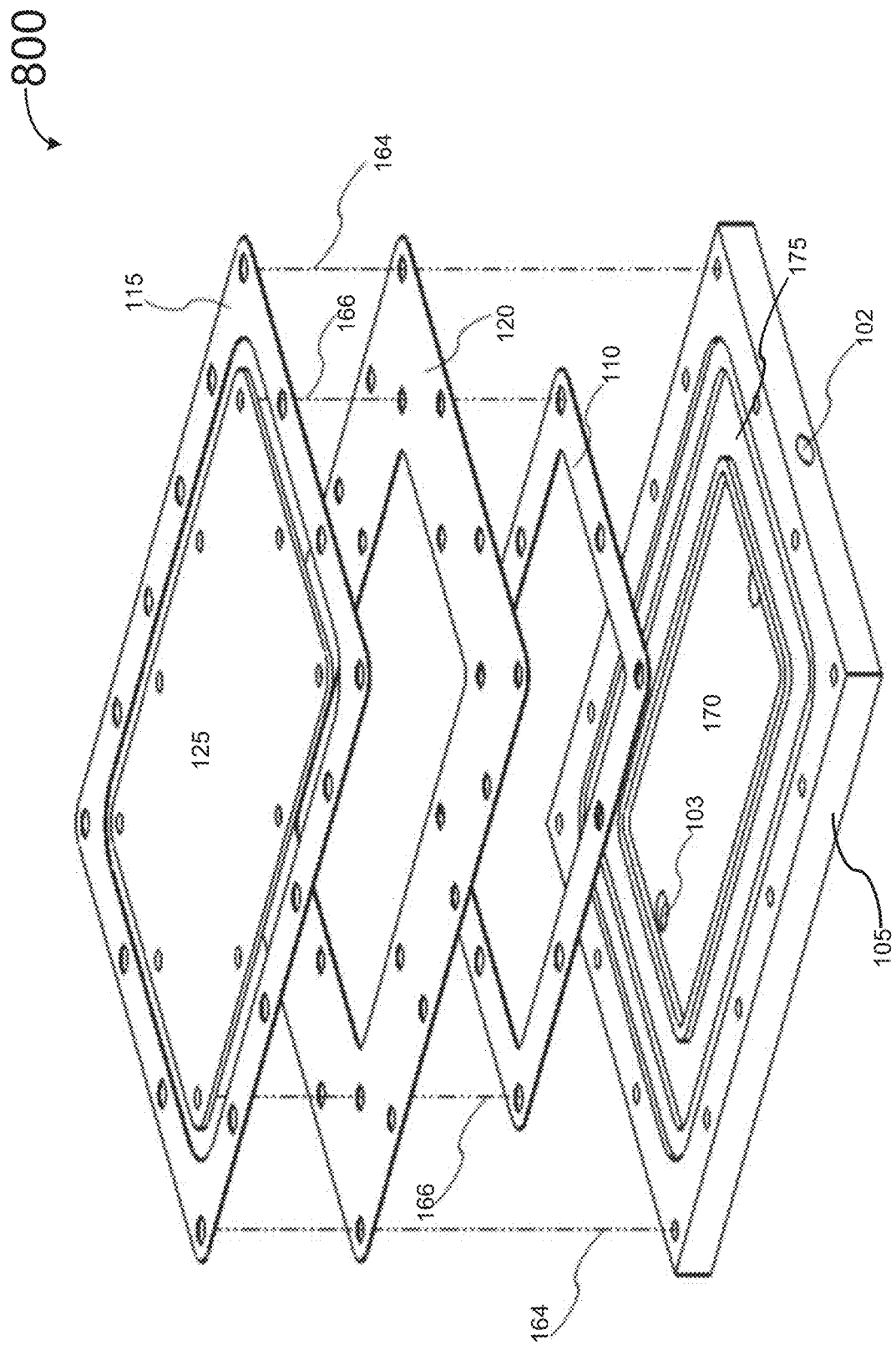
FIG. 8 is an exploded view of the structural elements for assembling a cooling apparatus rotated by 180 degrees.

FIG. 8 is an exploded view of the structural elements for assembling a cooling apparatus rotated by 180 degrees, in accordance with one embodiment. Cooling apparatus 800 in this example does not contain fins 130 on top of cold plate 125. Additionally, cold plate 105; stiffener plate 110, gasket 120, stiffener plate 115, and cold plate 125 in cooling apparatus 800 of FIG. 8 are identical to those in FIG. 5-6. In contrast to FIG. 5-6, cold plate 105; stiffener plate 110, gasket 120, stiffener plate 115, and cold plate 125 in cooling apparatus 800 of FIG. 8 are rotated by 180 degrees. Liquid coolant is received at inlet 102 and leaves at outlet 103, while passing through channel 170, as depicted by the groove in the center of cold plate 105. Stiffener plate 110 is physically contained within another groove, as represented by zone 175 within cold plate 105. Not all connections 164 and 166 are explicitly depicted in cooling apparatus 800.

Figure 9:
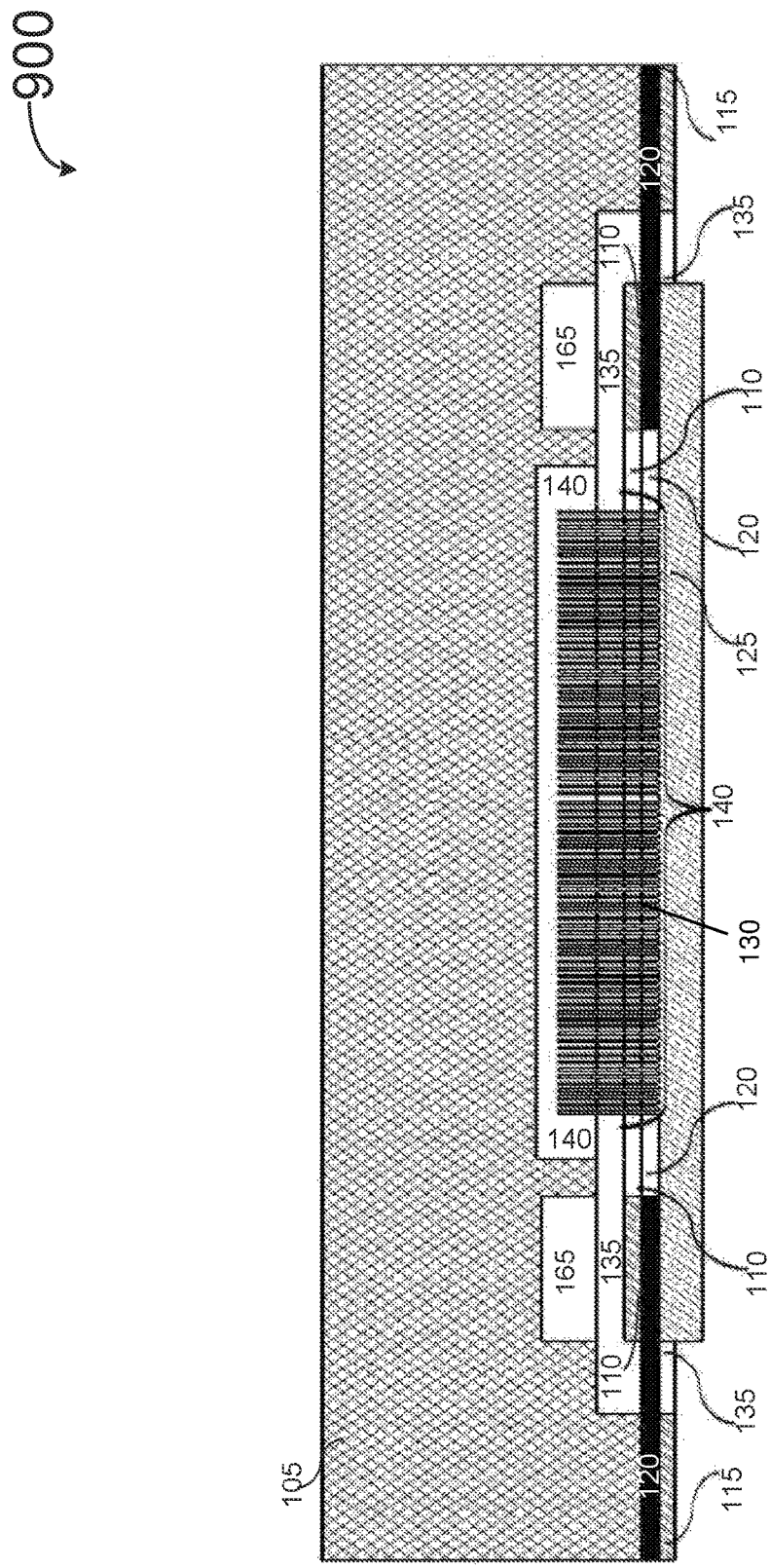
FIG. 9 is a first set of cross-sectional cuts of a simplified depiction of an assembled cooling apparatus.

FIG. 9 is a first cross-sectional view of an assembled cooling apparatus, in accordance with an embodiment. Cooling apparatus 900 is a cross-sectional view of the assembled cooling apparatus 100. As depicted in gasket 120, which seals the cooling liquid within cooling apparatus 900, is adjacent to fins 130, wherein fins 130 are skived copper fins that are a fluid heat sink. Gap 140 surrounds the top portions of fins 130. In this example, cold plate 125 is a rigid cold plate float also composed of copper.

The shaded portions of gasket 120 and stiffener plate 110 represent portions of these structural elements that are adjacent to gap 135. These shaded portions of gap 135, are within close proximity of gasket 120, and thus the dimensions of gap 135 may be increased or decreased by gasket 120, as described with respect to the description of gap 135 in FIG. 1. Zone 165 is applied as a relief zone from potential pressures induced by gasket 120.

Figure 10:
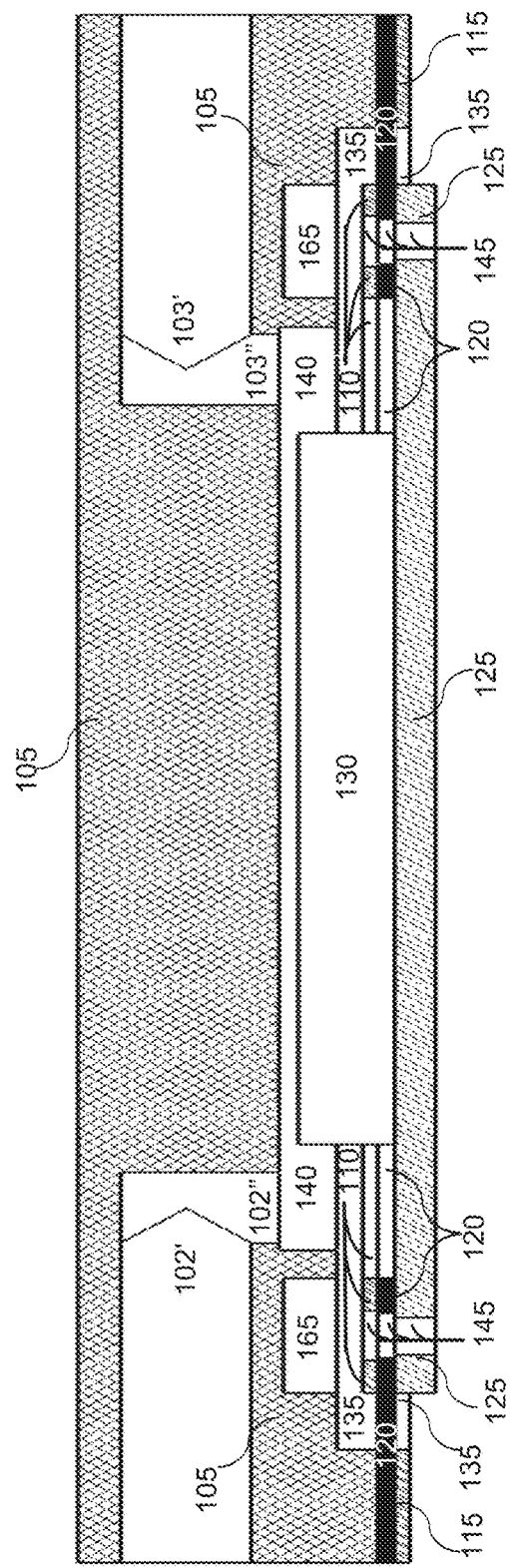
FIG. 10 is a second set of cross-sectional cuts of a simplified depiction of an assembled cooling apparatus.

FIG. 10 is a second set of cross-sectional cuts of a simplified depiction of an assembled cooling apparatus, in accordance with an embodiment. Cooling apparatus 1000 is a cross sectional view of the assembled cooling apparatus 300. In contrast to FIG. 9, cooling liquid is received by cooling apparatus 1000 at inlet 102'. The cooling liquid enters gap 140 at inlet 102" and passes over the top portions of fins 130 in gap 140 for enhanced heat transfer. The cooling liquid leaves gap 140 at outlet 103" and leaves cooling apparatus 1000 at outlet 103'. Additionally, in contrast to FIG. 9, gap 135, cold plate 125, the shaded portions of gasket 120, and stiffener plate 110 represent portions of these structural elements that are adjacent to fastener opening 145 in the left-hand side and right-hand sides of cooling apparatus 1000.

Figure 11:
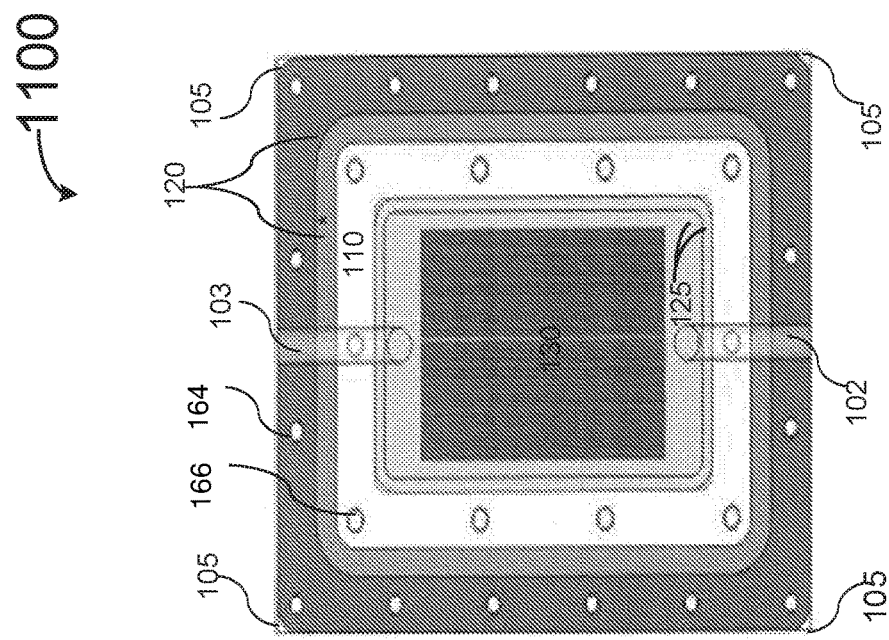
FIG. 11 is a plan view of an assembled cooling apparatus containing a sealing gasket and skived fins covered within a transparent cold plate.

FIG. 11 is a plan view of an assembled cooling apparatus containing a sealing gasket and skived fins covered within a transparent cold plate, in accordance with one embodiment. Cooling apparatus 1100 in this example includes base cold plate 105; floating cold plate 125; and sealing interface region in the form of gasket 120, wherein base cold plate 105 is a transparent conductive plastic. Additionally, fasteners, such as fasteners 155 and 157, are not used to connect stiffener plates 110 and 115 with gasket 120.

In this example, gasket 120, which is rectangular, has slightly rounded edges along its outer perimeter containing apertures for connection 166. Due to the slightly rounded edges in gasket 120, there are non-overlapping regions with cold plate 105, as depicted in the portions of cooling apparatus 1100 labeled with "105". The physical connection of gasket 120 along the periphery floating cold plate cold plate 125 results in the covering of the periphery of floating cold plate 125 and exposure of the portion of floating cold plate 125 that contains fins 130 and remaining area needed for a channel, such as channel 170 (which is not labeled in FIG. 11). The region of a common shading pattern labeled with "110" corresponds to stiffener plate 110, which is aligned with gasket 120 along connections 166. Gasket 120 is depicted in two shading patterns. The darker region of gasket 120 aligns with cold plate 105 along connections 164. The lighter region of gasket 120 denoted with "*", is similar or identical to regions 120* of gasket 120 in FIG. 7.

Figure 12:
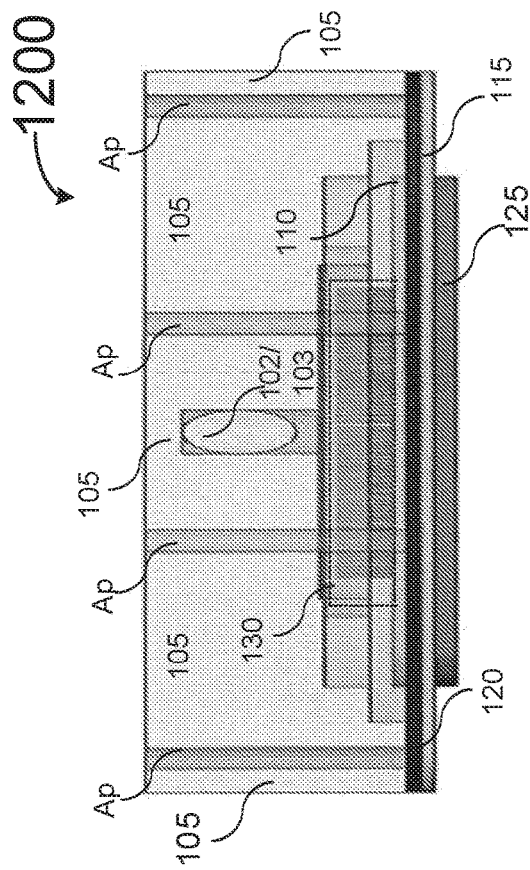
FIG. 12 is a side view depiction of an assembled cooling apparatus.
Figure 13:
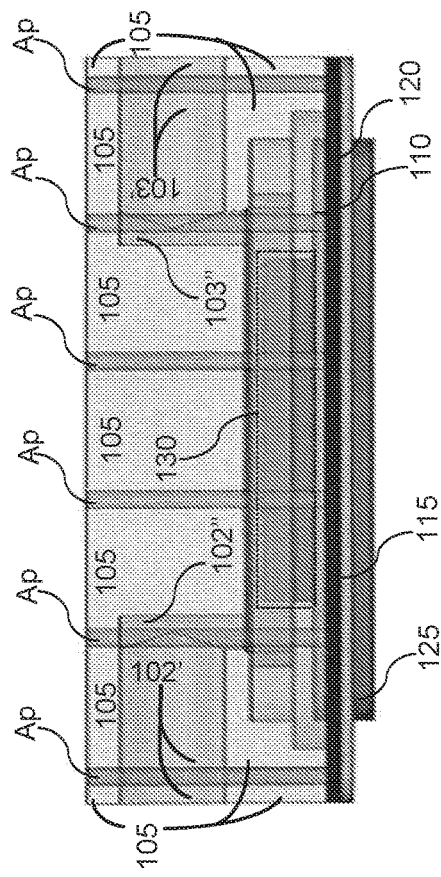
FIG. 13 is another side view depiction of an assembled cooling apparatus. Section 1300 is a different view of a side view of cooling apparatus 1200.

FIG. 12 and FIG. 13 are two different side view depictions of an assembled cooling apparatus. Cooling apparatuses 1200 and 1300 are both side views of cooling apparatus 1100, where fins 130 are skived copper fins.

The aperture columns adjacent to outside of cooling apparatuses 1200 and 1300 align with the outer connections (e.g., connection 164) along gasket 120 and stiffener plate 115. Similarly, the aperture columns within the interior of cooling apparatuses 1200 and 1300 align with the inner connections (e.g., connection 166) along stiffener plate 110 and gasket 120. Additionally, stiffener plate 110 fits into a groove of cold plate 105, wherein cold plate 105 is a transparent conductive plastic.

In the depiction of cooling apparatus 1200 in FIG. 12, "102/103" corresponds to inlet 102 or outlet 103, depending on the view point of an observer. Additionally, fins 130 are in an end-on view. In contrast to the depiction of cooling apparatus 1200, fins 130 are skived fins depicted in a box/layer format in cooling apparatus 1300. Inlet 102'; inlet 102"; outlet 103'; and outlet 103" in FIG. 13 are identical to inlet 102'; inlet 102"; outlet 103'; and outlet 103" in FIG. 2 and FIG. 10. However, some of the apertures labeled with "Ap" run through inlet 102'; inlet 102"; outlet 103'; and outlet 103" in FIG. 13.

Figure 14:
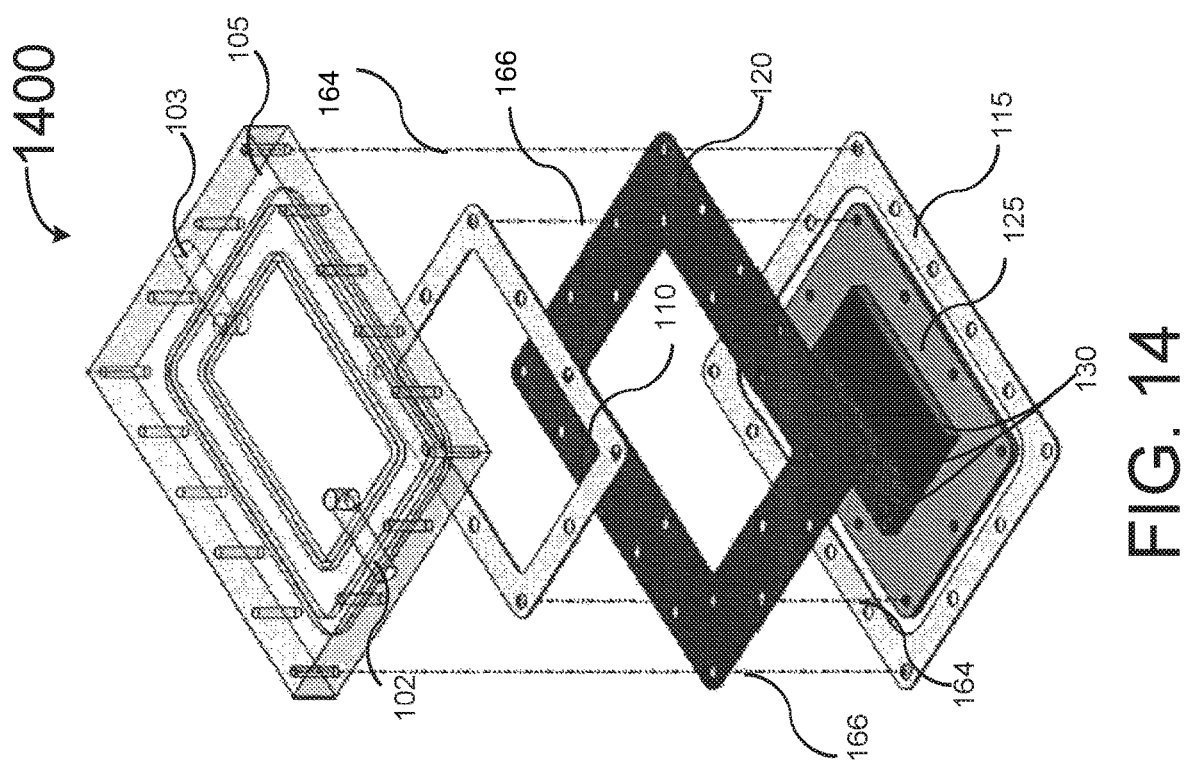
FIG. 14 is an exploded view of the structural elements for assembling a cooling apparatus containing a sealing gasket and fins.

FIG. 14 is an exploded view of the structural elements for assembling a cooling apparatus containing a sealing gasket and fins. In contrast to cooling apparatus 300 in FIG. 3, fasteners, such as fasteners 155 and 157, are depicted in cooling apparatus 1400 in FIG. 14. Additionally, cooling apparatus 1400 in FIG. 14 contains fins 130 attached to cold plate 125, whereas cooling apparatus 300 in FIG. 3 does not contain fins 130. In some embodiments, the cooling apparatus 1400 is assembled by leveraging physical connections within grooves and ridges. For example, stiffener plates 110 and 115 can fit into grooves on the external surface of gasket 120, and thus forming physical connections to gasket 120. The combination of gasket 120, stiffener plate 110, and stiffener plate 115 can fit into grooves within the external surface of cold plate 105 and cold plate 125. Additionally, ridges along the inside periphery of cold plate 105 can fit into grooves along the inside periphery of cold plate 125, and thus forming physical connections between cold plates.

Figure 15:
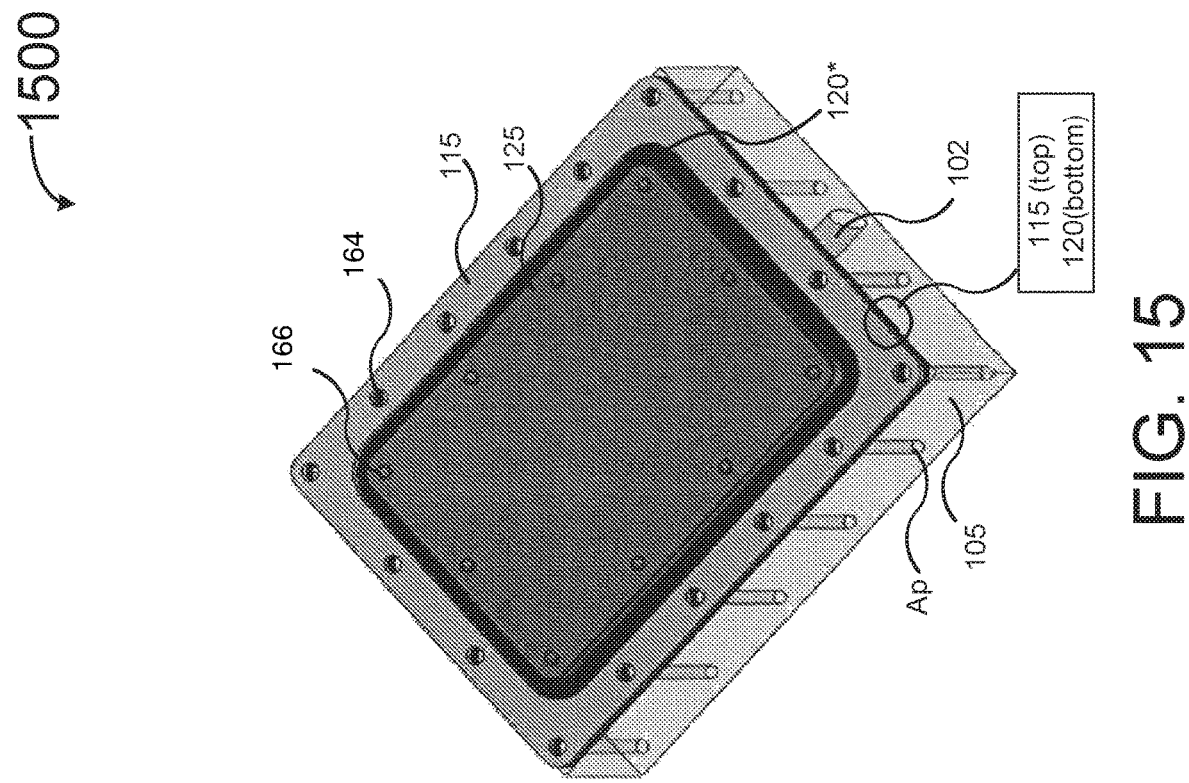
FIG. 15 is yet another plan view of yet another example of an assembled cooling apparatus.

FIG. 15 is yet another plan view of yet another example of an assembled cooling apparatus. In this illustrated example, the cooling apparatus in FIG. 14 is rotated by 180 degrees. Cooling apparatus 1500 is depicted in a bottom isometric view. This view illustrates exposed/uncovered regions 120* adjacent to stiffener plate 115 and cold plate 125, which results from connections similar to those with reference to FIG. 7. As noted with reference to FIG. 7, the exposed/uncovered regions 120* accommodate height differences and co-planarity tolerances among the devices being cooled.

Figure 16:
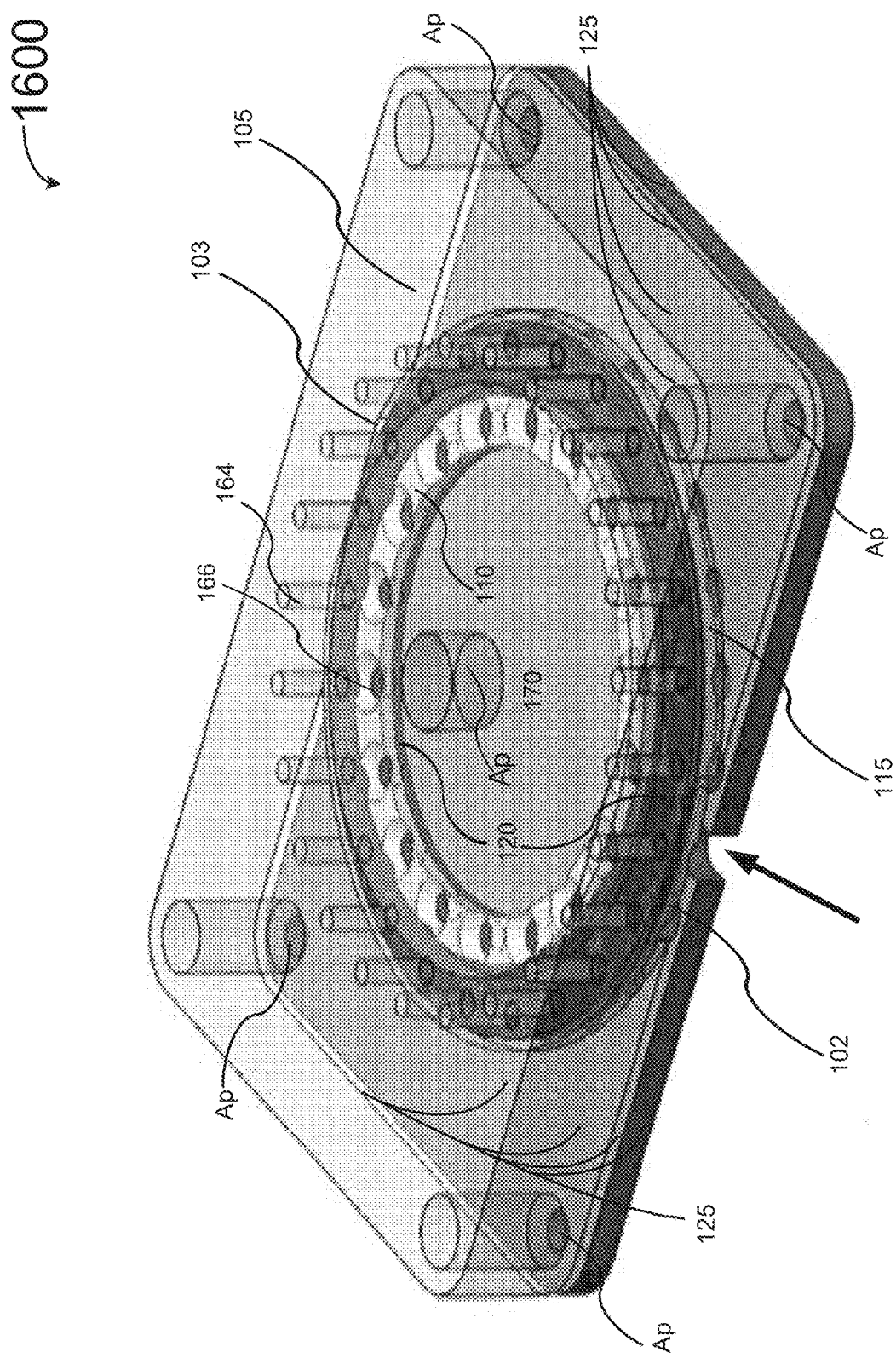
FIG. 16 is a plan-view of an assembled cooling apparatus containing a rounded shaped sealing gasket.

FIG. 16 is a plan-view of an assembled cooling apparatus containing a rounded shaped sealing gasket, in accordance with an embodiment. Cooling apparatus 1600 in this example includes base cold plate 105; floating cold plate 125; and sealing interface region in the form of gasket 120, wherein gasket 120 is a rounded shaped version of gasket 120 connected to the base cold plate and the floating cold plate not connected by fasteners (e.g., fasteners 155 and 157).

In this example, gasket 120 is a round-shaped gasket seal, as opposed to the rectangular-shaped gasket seal in FIG. 1-15. Similar to FIGS. 11-13, cold plate 105 is a transparent conductive plastic containing respective openings functioning as inlet 102 and/or outlet 103 and apertures. Near or at inlet 102, a bolded arrow points to the carved-out portion of cold plate 125.

Although the example illustrated in FIG. 16 includes 29 apertures, other quantities of apertures may be present. In cooling apparatus 1600, the 4 wide connector apertures are near or at a respective edge of the transparent conducting plastic for fitting into and connect cold plate 105 at or near a respective edge of cold plate 125. Additionally, the 1 wide aperture resides in the center of channel 170 of cold plate 125 to form an external groove in which portions of a device may reside or be placed in. The 24 narrow connector apertures are aligned along the outer portions/perimeter of gasket 120 for connecting directly above a rounded shaped stiffener plate 115 along connections 164. Each of the 24 narrow connector apertures correspond to a respective dotted circle, as depicted in FIG. 16, for fitting in a screw or any other type of fastener placed in between stiffener plate 115 and gasket 120. In this example, a rounded shaped stiffener plate 110 is physically connected directly above gasket 120, wherein the rounded shaped stiffener plate 110 contains concave circular openings that align with the inner portions/perimeter of gasket 120 along connections 166 and correspond with respective dotted circles.

FIG. 17 is a side-view depiction of an assembled cooling apparatus containing a rounded shaped gasket. Cooling apparatus 1700 is a side view depiction of cooling apparatus 1600. The bolded arrow pointing to cold plate 125 corresponds to the carved-out portion of cold plate 125 in cooling apparatus 1600 and the line of sight for observing the cooling apparatus. The dotted line with arrows on each end correspond to inlet 102 in FIG. 16. In contrast to the examples disclosing a rectangular shaped gasket 120, raised step 180 is a structural element placed between cold plate 125 and stiffener plate 115 within cooling apparatus 1700. Raised step 180 may be composed of metal, plastic, or any other material that is able to raise the height of a cold plate 105 to get around gasket 120 and stiffener plate 115. The dashed lines in cooling apparatus 1700 represent threaded screw holes and the accompanying hidden lines represent features inside the associated solid object. The solid object, such as a screw or fastener, can fit into the screw holes. The apertures denoted with "Ap" near the edge of cold plate 105 and in the center of cold plate 105 correspond to the wide connector apertures and wide aperture in FIG. 16, respectively. The apertures in cold plate 105 denoted by connection 164 are aligned with the outer periphery of stiffener plate 115.

Figure 19:
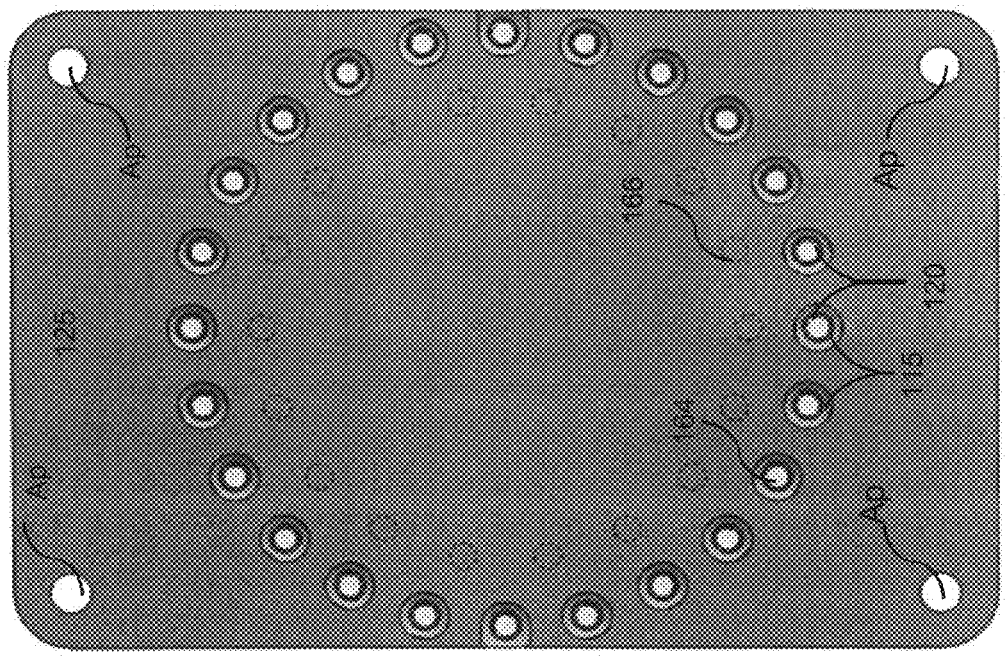
FIG. 19 is a bottom view of a partially assembled cooling apparatus.
Figure 18:
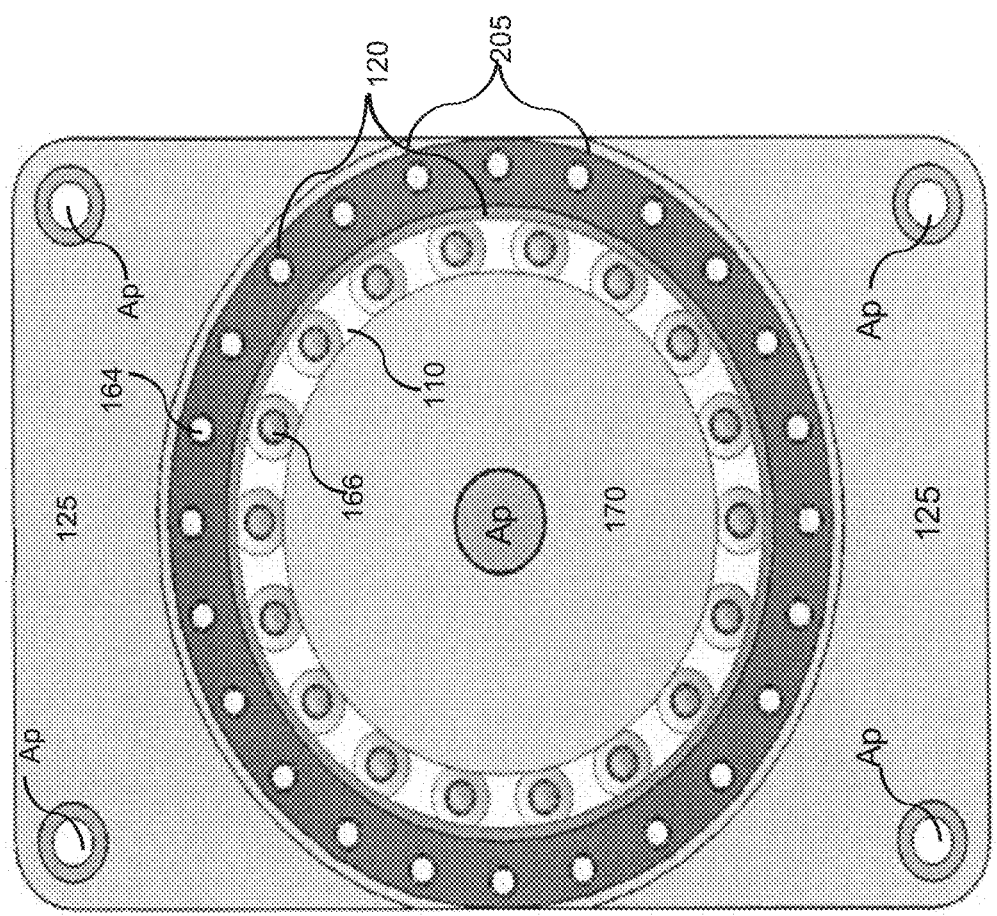
FIG. 18 is a top view of a partially assembled cooling apparatus.

FIG. 18 and FIG. 19 are depictions of a partially assembled cooling apparatus. Partial assembly 1800 in FIG. 18 and partial assembly 1900 in FIG. 19 are depictions of the same cooling apparatus where cold plate 105 is not physically connected to the rounded shaped gasket 120. However, partial assembly 1900 is the resulting view from rotating partial assembly 1800 by 180 degrees. The physical connection of cold plate 105 to partial assembly 1800 and partial assembly 1900 yield cooling apparatus 1600.

In this example illustrated in partial assembly 1800 in FIG. 18, rounded shaped gasket 120 can fit inside zone 205, which may be an indented groove in cold plate 125. Other indented groves in cold plate 125 reside at the rounded edges and center of cold plate 125. These other indented grooves in cold plate 125 can form physical connections to a ridge in cold plate 105. Channel 170 in cold plate 125 spans along the inner perimeter of stiffener plate 110, which physically connects to the rounded shaped gasket 120. The outer perimeter of rounded shaped gasket 120 and inner perimeter of gasket 120 are denoted by connections 164 and 166 in FIG. 18, respectively. The unshaded circles and dotted circles in cold plate 125 labeled as connections 164 and 166, respectively, in FIG. 19, correspond to the outer perimeter of rounded shaped gasket 120 and inner perimeter of gasket 120, respectively. When observing the other side of cold plate 125 (i.e., the backside) from a top-view, portions of the rounded shaped gasket 120 and stiffener plate 115 are visible, as depicted in partial assembly 1900. In this example illustrated in partial assembly 1900 in FIG. 19, the area of the visible portions of rounded shaped gasket 120 is less than the area of the visible portions of stiffener plate 115.

Figure 20:
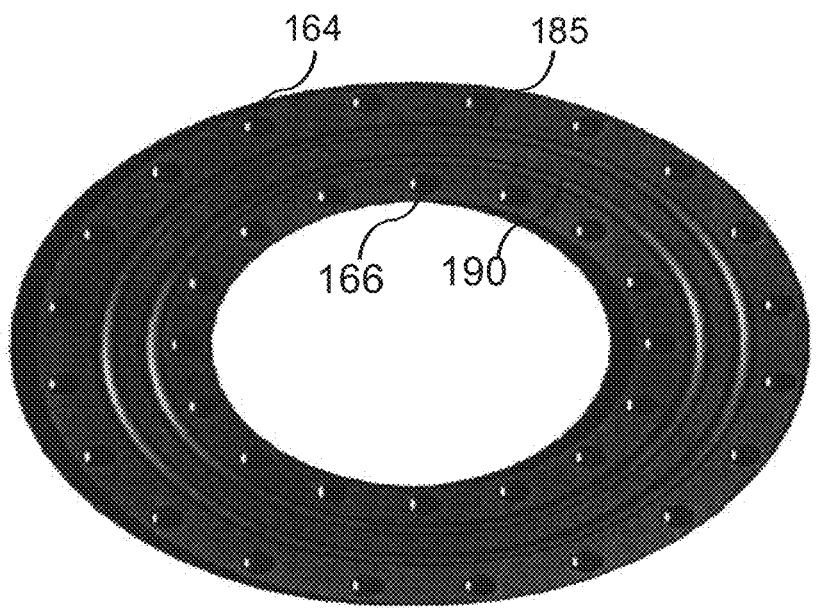
FIG. 20 is a depiction of a rounded shaped gasket.

FIG. 20 is a depiction of a rounded shaped gasket. Gasket 2000 in this example is an isometric view of a rounded shaped version of gasket 120. The openings along the inside and outside portions/perimeter of gasket 120 in gasket 2000 are aligned for connections 164 and 166, as described above. In this example depicted in FIG. 20, ridge 185 and ridge 190 are the outer and inner ridges in gasket 120, respectively, that reside on the interior surface of gasket 120. In this example, ridges 185 and 190 are connected to cold plate 105 and cold plate 125 to provide a strong seal that protects against the leakage of coolants and protect against gasket extrusions. In some instances, ridges 185 and 190 engage in a groove, for example in zone 175 of cold plate 105 in FIG. 8, to prevent cold plate 105 from sliding against another plate or other undesired movements that may be lead to mechanical failures.

Figure 21:
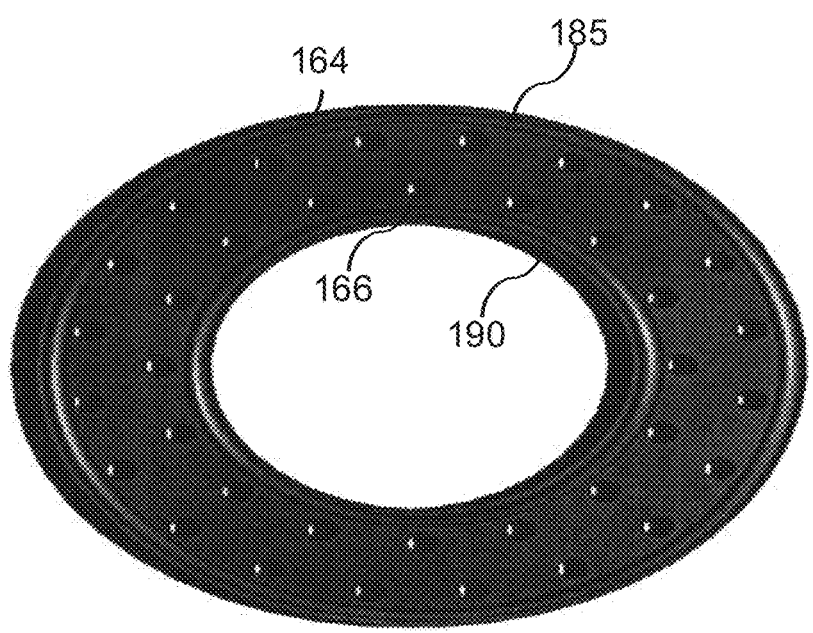
FIG. 21 is depiction of another rounded shaped gasket.

FIG. 21 is a depiction of another rounded shaped gasket. Gasket 2100 in this example is an isometric view of a rounded shaped version of gasket 120. Similar to gasket 2000, there are openings for inner and outer connections. In contrast to FIG. 20, ridge 185 and ridge 190 are the outer and inner ridges in gasket 120, respectively, that reside on the exterior surface of gasket 120 in FIG. 21. As noted above with gasket 2000, gasket 2100 may provide a strong seal that protects against the leakage of coolants and protects against gasket extrusions. Depending on the design of cold plate 105 and cold plate 125, which contain grooves, and the desired application, some instances are better served by gasket 2100 as opposed to gasket 2000. Thus, the placement of ridges in gasket 2100 may dictate where grove sealing features may comport to grooves in cold plate 105 and cold plate 125.

Figure 22:
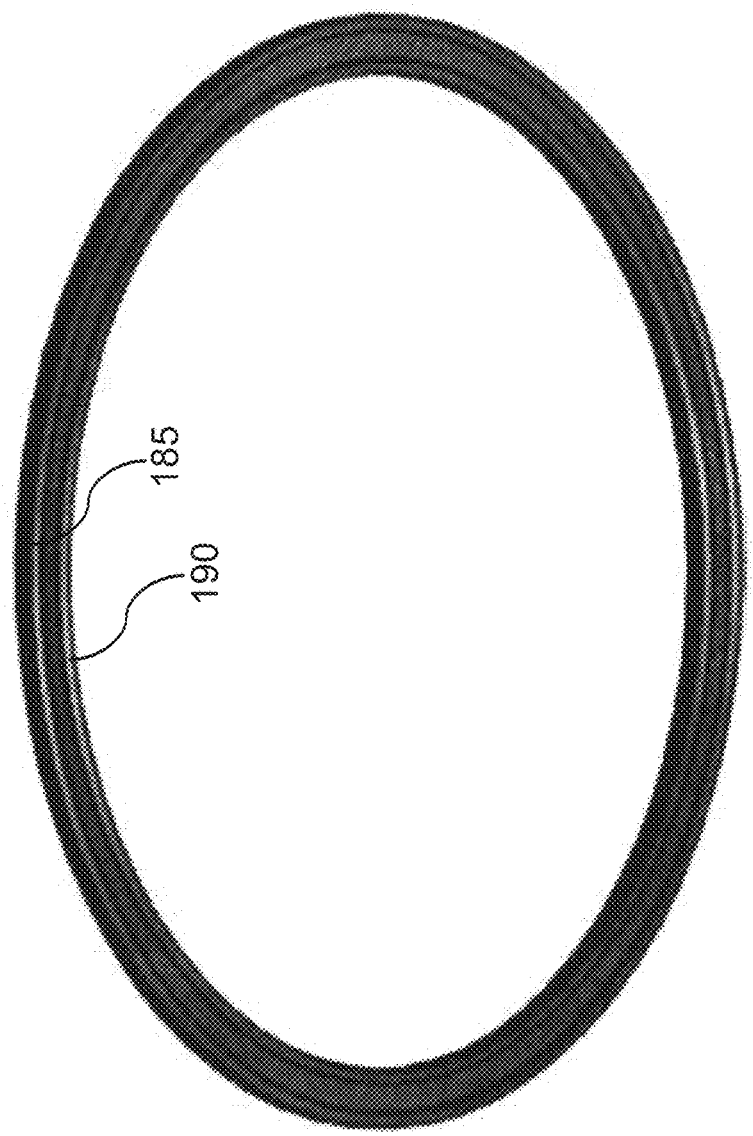
FIG. 22 is a depiction of an O-ring type rounded shaped gasket.

FIG. 22 is a depiction of an O-ring type rounded shaped gasket. Gasket 2200 in this example is an isometric view of an O-ring type rounded shaped version of gasket 120. Additionally, gasket 2200 is a variant of gasket 120 that does not have the openings contained in gaskets 2000 and 2100. Thus, gasket 2200 does not support fasteners connected to a gasket, as observed with gaskets 2000 and 2100. In this example, ridge 185 and ridge 190 are the outside ridge and inside ridge in gasket 2200, respectively, that reside on the exterior surface of gasket 2200 in FIG. 22. As referenced in FIG. 20 and FIG. 21, there are instances where gasket 2200 is a preferred design to protect against gasket extrusion and leakage of the liquid coolant.

Figure 23:
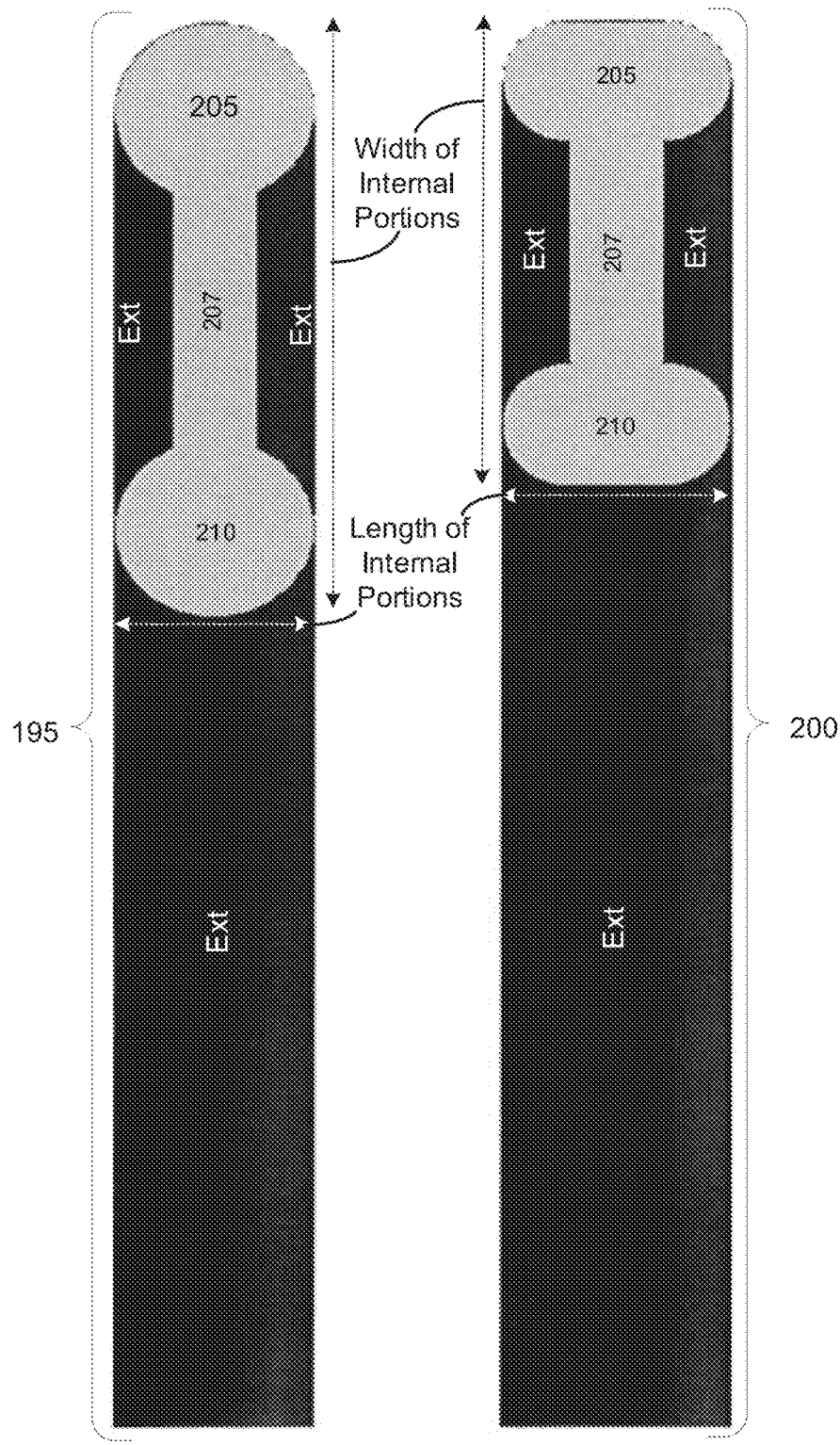
FIG. 23 is a depiction of cross-sections of gasket seals.

FIG. 23 is a depiction of cross-sections of gasket seals. Gasket environment 2300 in this example includes a cross-sectional view of gaskets 195 and 200. Gaskets 195 and 200, which are similar or identical to gasket 120, are depicted in two shades. The darker shaded portions and lighter shaded portions of gaskets 195 and 200 are the external (as denoted by "Ext" in FIG. 23) and internal surfaces of gasket 120, respectively. Additionally, the internal portions include connecting region 207 between outer region 205 and an inner region 210. Ridges, such ridges 185 and 190, form along outer region 205 and inner region 210, respectively. The width and length of internal portions may differ for the gaskets which are physically connected to the same rigid cold plate 105 and float cold plate 125. In this example, the differences in width and length result from instances where the internal portions of gaskets 195 and 200 are of different shapes and adjacent to the Ext portions of the respective gasket.

The shape of outer region 205 and inner region 210 in gasket 195 is circular. In contrast, the shape of outer region 205 and inner region 210 in gasket 200 is rectangular. The rectangular shape in gasket 200 gives the best total surface area contact with a liquid coolant, whereas the circular shape in gasket 195 does not have as much total surface area contact with the liquid coolant. Additionally, the length of the internal portions is greater for gasket 200 than for gasket 195, as depicted in FIG. 23. This greater length and the rectangular shape in gasket 200 allow a gasket to have a greater surface area contact with the cooling liquid to increase heat transfer needed to cool devices in contact with the cold plates.

The width of the internal portions is greater for gasket 195 than for gasket 200, as depicted in FIG. 23. This greater width and the circular shape in gasket 195 allows for equalized stresses at every point on the perimeter of the gasket 120 when mechanical pressures are applied on gasket 120. Additionally, the circular shape in gasket 195 guards against failures due to uneven stresses. In contrast, the rectangular shape in gasket 200 becomes more prone to failures due to uneven stresses, despite being more effective and efficient at cooling devices.

The cooling apparatus described in the embodiments above may be directed to a computing or electronics system. The computing or electronics may include a processor, a display (e.g., a monitor); a network interface (e.g., a Local Area Network LAN, a wireless 802.11x LAN, a 3G/4G/5G mobile WAN or a WiMax WAN); and a computer-readable medium. Each of these components may be operatively coupled to a bus (e.g., an EISA, a PCI, a USB, a FireWire, a NuBus, or a PDS). The computer readable medium may be any suitable medium that participates in providing instructions to the processor for execution. For example, the computer readable medium may be non-volatile media, such as an optical or a magnetic disk; volatile media, such as memory. The computer-readable medium may also store an operating system, such as MS Windows, Unix, Linux, or Mac OS; and network applications. The operating system may be multi-user, multiprocessing, multitasking, multi-threading, real-time and the like. The operating system may also perform basic tasks such as recognizing input from input devices, such as a keyboard or a keypad; sending output to the display; keeping track of files and directories on the computer readable medium; controlling peripheral devices (e.g., disk drives, printers, image capture device; and managing traffic on the bus. The network applications may include various components for establishing and maintaining network connections (e.g., machine-readable instructions for implementing communication protocols including TCP/IP, HTTP, Ethernet, USB, and FireWire).

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An apparatus, wherein the apparatus comprises:
a first plate and a second plate, wherein the second plate comprises a thermally conductive material having a thermal conductivity value sufficient to transfer heat generated by one or more devices to a liquid coolant;
a gasket that connects the first plate to the second plate, wherein the gasket is compliant;
a first stiffener plate and a second stiffener plate, wherein the gasket is positioned between the first stiffener plate and the second stiffener plate, the first stiffener plate is connected to the first plate with an outer portion of the gasket clamped therebetween, and the second stiffener plate is connected to the second plate with an inner portion of the gasket clamped therebetween; and
a channel that forms in between the first and second plates by connecting the gasket to the first plate and the second plate, wherein the liquid coolant flows within the channel to cool the one or more devices.

2. The apparatus of claim 1, wherein the gasket fits into a groove in the first plate, and wherein the gasket comprises at least one of a rectangular shape and a circular shape.

3. The apparatus of claim 2, wherein the gasket connected to the first plate in the rectangular shape has a greater surface area than the gasket connected to the first plate in the circular shape.

4. The apparatus of claim 2, wherein the gasket in the circular shape has a first ridge layer and a second ridge layer to prevent extrusion of the gasket.

5. The apparatus of claim 2, wherein the gasket is in a circular shape, wherein the circular shape equalizes stresses applied on points on an outer portion of the gasket.

6. The apparatus of claim 1, wherein the gasket comprises:
an intermediate portion in between the outer portion and the inner portion, wherein the intermediate portion is not in contact with the first plate and not in contact with the second plate such that the first plate and the second plate can move relative to one another.

7. The apparatus of claim 1, wherein the gasket connects the first plate to the second plate such that the first and second plates can move relative to one another.

8. The apparatus of claim 1, wherein the gasket forms liquid tight seals with the first and second plates such that the channel is liquid tight excluding inlet and outlet openings.

9. The apparatus of claim 1, further comprising:
one or more fins connected to the second plate, wherein the one or more fins extend into the channel.

10. The apparatus of claim 9, wherein the plurality of fins comprises one of the following: surface enhancements, skived fins, pin fins, machined fins, and extruded fins.

11. The apparatus of claim 1, further comprising:
one or more thermal interface materials connected to the second plate.

12. A computing device comprising:
one or more computing components; and
a cold plate device that is thermally coupled to the one or more computing components to cool the one or more computing components, the cold plate device comprising:
a first plate and a second plate, wherein the second plate comprises a thermally conductive material having a thermal conductivity value sufficient to transfer heat generated by the one or more computing components to a liquid coolant;
a gasket that connects the first plate to the second plate, wherein the gasket is a compliant material;
a first stiffener plate and a second stiffener plate, wherein the gasket is positioned between the first stiffener plate and the second stiffener plate, the first stiffener plate is connected to the first plate with an outer portion of the gasket clamped therebetween and the second stiffener plate is connected to the second plate with an inner portion of the gasket clamped therebetween; and
a channel that forms in between the first and second plates by connecting the gasket to the first plate and the second plate, wherein the liquid coolant flows within the channel to cool the one or more computing components.

13. The computing device of claim 12, further comprising:
one or more thermal interface materials connected to the second plate.

14. The computing device of claim 12, further comprising:
one or more fins connected to the second plate, wherein the one or more fins extend into the channel.

15. The computing device of claim 13, wherein the plurality of fins comprises one of the following: surface enhancements, skived fins, pin fins, machined fins, and extruded fins.

16. The computing device of claim 12, wherein the gasket comprises:
an intermediate portion in between the outer portion and the inner portion, wherein the intermediate portion is not in contact with the first plate and not in contact with the second plate such that the first plate and the second plate can move relative to one another.

17. The computing device of claim 12, wherein the gasket forms liquid tight seals with the first and second plates such that the channel is liquid tight excluding inlet and outlet openings.

18. A method of cooling a component of a computing device, the method comprising:
providing a cooling apparatus comprising:
a first plate and a second plate, wherein the second plate comprises a thermally conductive material having a thermal conductivity value sufficient to transfer heat generated by the component to a liquid coolant;
a gasket that connects the first plate to the second plate, wherein the gasket is a compliant material; and
a first stiffener plate and a second stiffener plate, wherein the gasket is positioned above one of the first or the second stiffener plates and positioned below the other stiffener plate, the first stiffener plate is connected to the first plate with an outer portion of the gasket clamped therebetween and the second stiffener plate is connected to the second plate with an inner portion of the gasket clamped therebetween;
thermally coupling the second plate to the component to transfer the heat generated by the component to the liquid coolant; and
connecting an inlet and an outlet of the cooling apparatus into the liquid cooling loop such that the liquid coolant flows through a channel within the cooling apparatus.

19. The method of claim 18, further comprising:
enhancing heat transfer from the second plate to the liquid coolant through one or more fins connected to the second plate.

20. The method of claim 18, wherein the gasket forms liquid tight seals with the first and second plates such that the channel is liquid tight excluding the inlet and the outlet.

\* \* \* \* \*